(12) United States Patent
Yonejima et al.

(10) Patent No.: US 10,163,663 B2
(45) Date of Patent: Dec. 25, 2018

(54) SUBSTRATE PROCESSING APPARATUS, EXHAUST SYSTEM AND METHOD OF MANUFACTURING SEMICONDUCTOR DEVICE

(71) Applicant: HITACHI KOKUSAI ELECTRIC INC., Tokyo (JP)

(72) Inventors: Toshihiko Yonejima, Toyama (JP); Masanori Okuno, Toyama (JP); Masakazu Sakata, Toyama (JP); Hiroki Okamiya, Toyama (JP); Takeshi Kasai, Toyama (JP); Katsuaki Nogami, Toyama (JP); Takashi Ozaki, Toyama (JP); Kenji Kanayama, Toyama (JP); Unryu Ogawa, Toyama (JP); Seiyo Nakashima, Toyama (JP); Tomoyuki Yamada, Toyama (JP); Masayuki Yamada, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 15/820,793

(22) Filed: Nov. 22, 2017

(65) Prior Publication Data
US 2018/0144953 A1 May 24, 2018

(30) Foreign Application Priority Data
Nov. 24, 2016 (JP) .................................. 2016-227995

(51) Int. Cl.
*H01L 21/67* (2006.01)
*C23C 16/24* (2006.01)
(Continued)

(52) U.S. Cl.
CPC ........ *H01L 21/67017* (2013.01); *C23C 16/24* (2013.01); *C23C 16/345* (2013.01);
(Continued)

(58) Field of Classification Search
None
See application file for complete search history.

(56) References Cited

U.S. PATENT DOCUMENTS 4,352,643 A * 10/1982 Iijima ................... F04D 29/661
248/610
9,581,510 B1 * 2/2017 Idris ....................... G01L 9/0008
(Continued)

FOREIGN PATENT DOCUMENTS

| JP | 2000-254480 A | 9/2000 |
| JP | 2006-190812 A | 7/2006 |

(Continued)

*Primary Examiner* — Angel Roman
(74) *Attorney, Agent, or Firm* — Volpe and Koenig, P.C.

(57) ABSTRACT

A configuration capable of increasing an exhaust capability of an apparatus without degrading an operation of the apparatus includes: a processing furnace; an exhaust unit configured to exhaust a gas from a process chamber defined by the processing furnace, the exhaust unit having a first sidewall and a second sidewall opposite to the first sidewall; and an exhaust device disposed adjacent to the exhaust unit and connected to the exhaust unit via a connecting pipe provided with a vibration-absorbing member, the exhaust device having a first sidewall and a second sidewall opposite to the first sidewall, wherein the processing furnace, the exhaust unit and the exhaust device are disposed on a same plane, and only the first sidewall of the first and the second sidewalls of the exhaust device is disposed in a space defined by extensions of the first and the second sidewalls of the exhaust unit.

9 Claims, 19 Drawing Sheets

(51) Int. Cl.
  *C23C 16/34* (2006.01)
  *C23C 16/455* (2006.01)
  *C23C 16/44* (2006.01)
  *H01L 21/02* (2006.01)
  *H01L 21/677* (2006.01)

(52) U.S. Cl.
  CPC ...... C23C 16/4408 (2013.01); C23C 16/4412 (2013.01); C23C 16/45565 (2013.01); H01L 21/6719 (2013.01); *H01L 21/0217* (2013.01); *H01L 21/02271* (2013.01); *H01L 21/67098* (2013.01); *H01L 21/67248* (2013.01); *H01L 21/67742* (2013.01)

(56) References Cited

U.S. PATENT DOCUMENTS

| | | | |
|---|---|---|---|
| 9,970,459 B2* | 5/2018 | Miyamoto | F04D 29/605 |
| 2003/0035737 A1* | 2/2003 | Ishikawa | F04D 19/04 |
| | | | 417/309 |
| 2005/0056220 A1* | 3/2005 | Aoki | H01L 21/02238 |
| | | | 118/722 |
| 2008/0093023 A1* | 4/2008 | Tomita | C23C 16/4405 |
| | | | 156/345.26 |
| 2012/0091362 A1* | 4/2012 | Tsuji | F16F 9/306 |
| | | | 250/441.11 |

FOREIGN PATENT DOCUMENTS

| | | |
|---|---|---|
| JP | 2007-231938 A | 9/2007 |
| JP | 2015-227618 A | 12/2015 |

* cited by examiner

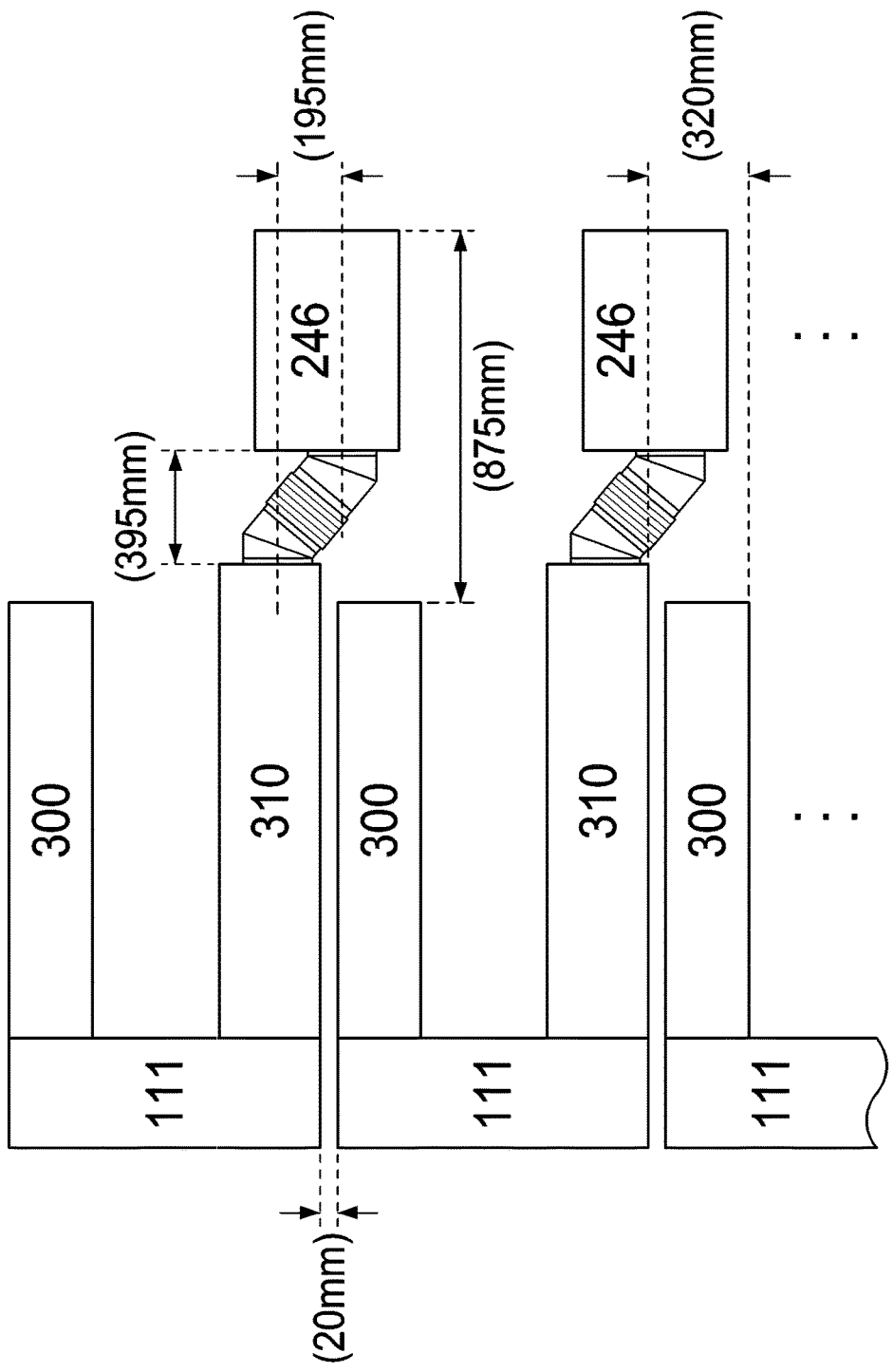

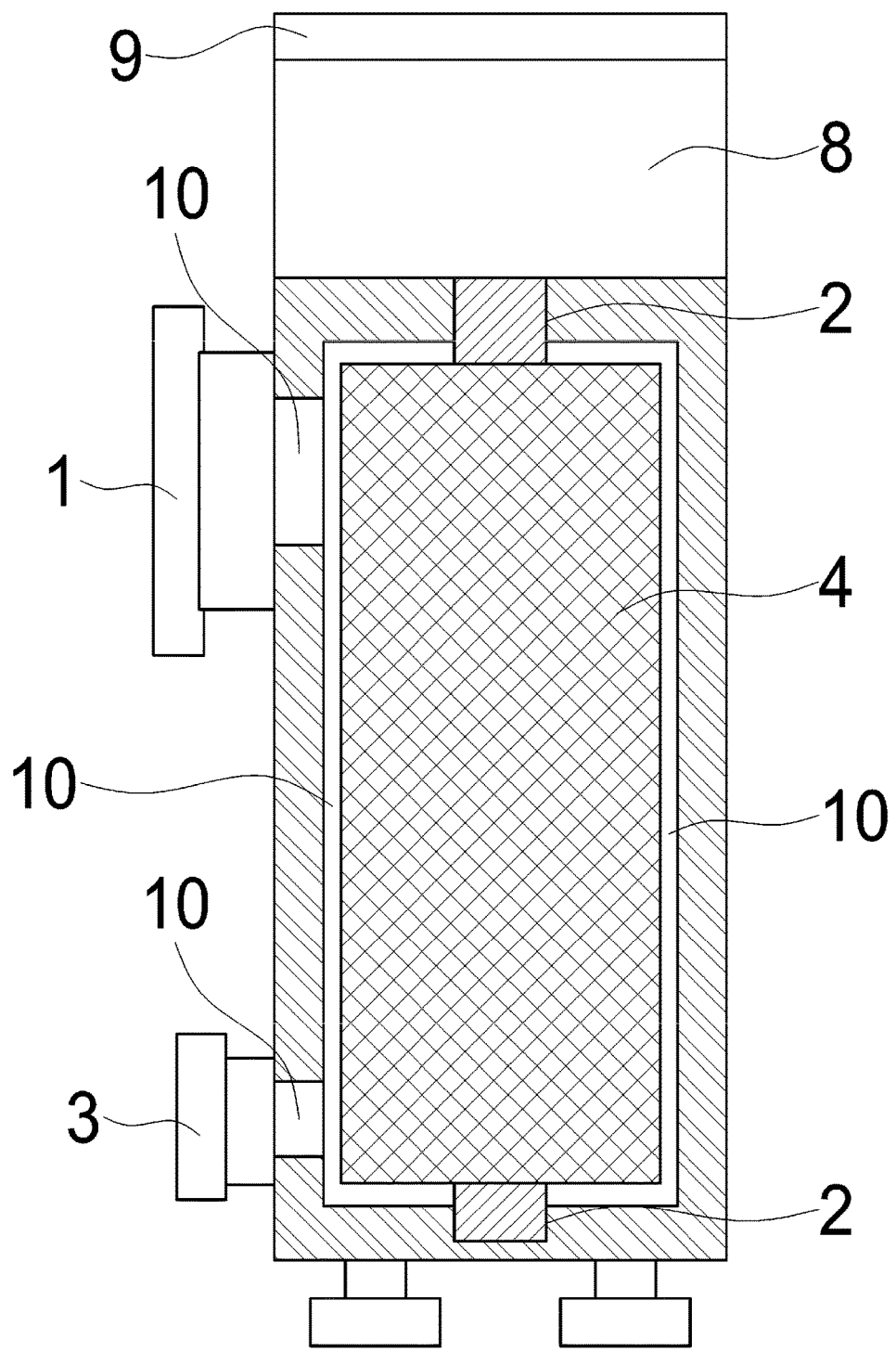

SUBSTRATE PROCESSING APPARATUS, EXHAUST SYSTEM AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2016-227995, filed on Nov. 24, 2016, the entire contents of which are hereby incorporated by reference.

BACKGROUND

1. Field

The present disclosure relates to an exhaust system and a substrate processing apparatus including the exhaust system and a method of manufacturing a semiconductor device.

2. Description of the Related Art

Conventional vertical type semiconductor manufacturing apparatuses (hereinafter referred to as "substrate processing apparatus") and pump systems coupled to the substrate processing apparatus are installed apart from each other in a factory for manufacturing semiconductors. For example, the substrate processing apparatus may be installed on the third floor in the factory, and the pump system may be installed on the first floor (or second floor). It is desirable to have the exhaust pipe larger in diameter and shorter in length in order to avoid the influence of conductance, and it is desirable to minimize the number of bent parts such as an elbow-shape pipe. However, since the exhaust pipe must connect the substrate processing apparatus installed on the third floor in the factory to the pump system installed on the first floor, the increase in the diameter of the exhaust pipe and the minimization of the length of the exhaust pipe have not been realized.

In the conventional manufacturing process, the influence of the conductance of the exhaust pipe is not large. However, in the latest processes involving three-dimensional (3D) devices with large area, improvement in the exhaust capability of substrate processing apparatus is of importance. That is, similar to a single wafer type semiconductor manufacturing apparatus, it is required to arrange the pump in the vicinity of the process chamber. In the conventional substrate processing apparatus, an exhaust device (pump), which is directly provided in a load lock chamber hermetically connected to the process chamber, exhaust the atmosphere of the process chamber.

However, the conventional substrate processing apparatus wherein the inner atmosphere of the process chamber is exhausted by the pump provided in the loadlock chamber during the processing of the substrate, is not realistic. Moreover, when the pump is installed near the substrate processing apparatus, the footprint, the vibrations and the like would affect the operation of the substrate processing apparatus.

SUMMARY

Described herein is a configuration capable of increasing an exhaust capability of an apparatus without degrading an operation of the apparatus.

According to one embodiment of the configuration described herein, there is provided a configuration including: a processing furnace; an exhaust unit configured to exhaust a gas from a process chamber defined by the processing furnace, the exhaust unit having a first sidewall and a second sidewall opposite to the first sidewall; and an exhaust device disposed adjacent to the exhaust unit and connected to the exhaust unit via a connecting pipe provided with a vibration-absorbing member, the exhaust device having a first sidewall and a second sidewall opposite to the first sidewall, wherein the processing furnace, the exhaust unit and the exhaust device are disposed on a plane, and only the first sidewall of the first and the second sidewalls of the exhaust device is disposed in a space defined by extensions of the first and the second sidewalls of the exhaust unit.

BRIEF DESCRIPTION OF THE DRAWINGS

FIG. 6 schematically illustrates an arrangement of multiple substrate processing apparatuses according to the embodiment.

FIG. 10 schematically illustrates an exhaust device of the substrate processing apparatus according to the embodiment.

DETAILED DESCRIPTION

Embodiment

Hereinafter, an embodiment will be described.

(1) Configuration of Substrate Processing Apparatus

Hereinafter, substrate processing apparatus 100 according to the embodiment will be described with reference to FIGS. 1 and 2.

Figure 1:
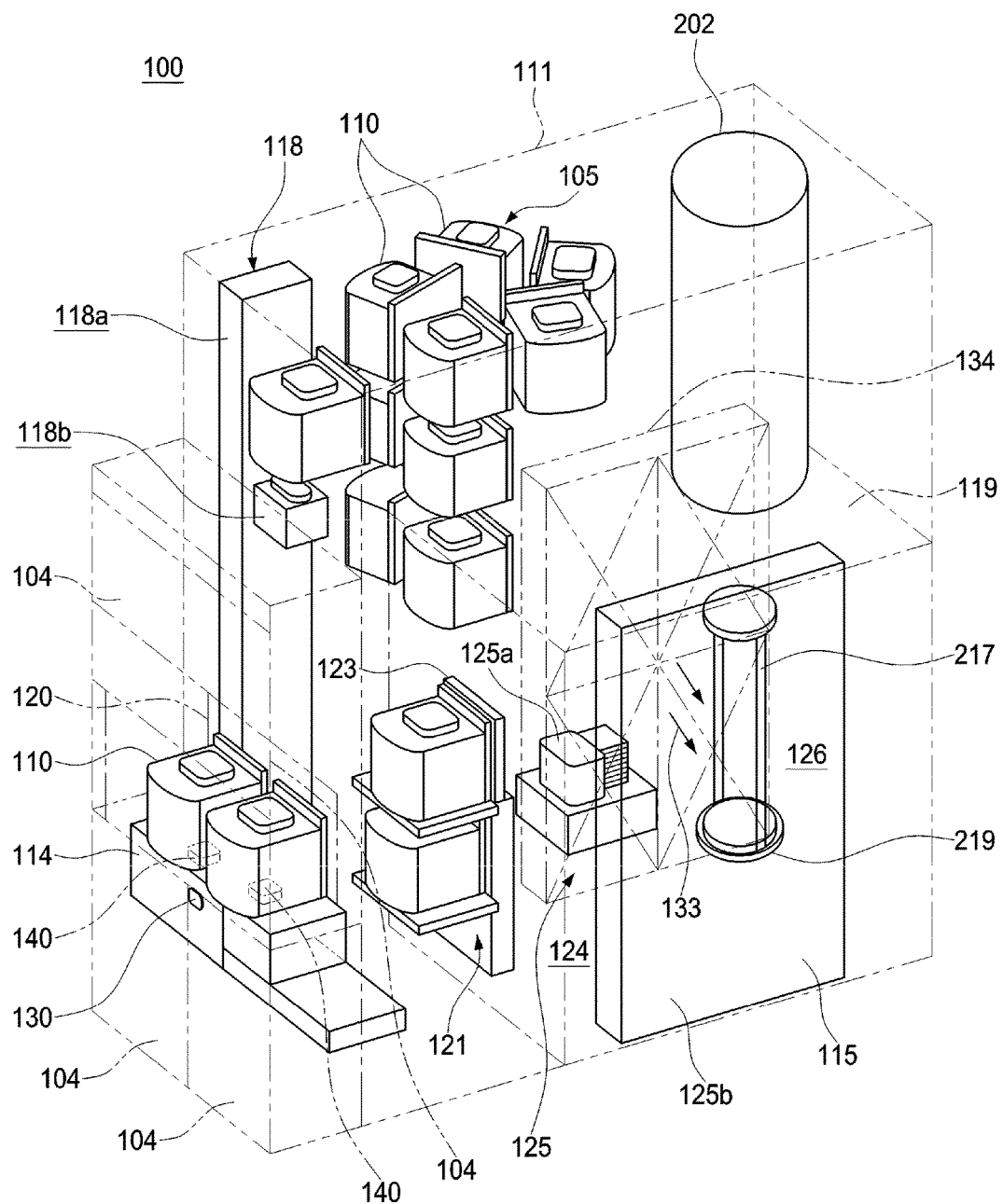
FIG. 1 schematically illustrates substrate processing apparatus according to an embodiment described herein.

As shown in FIG. 1, the substrate processing apparatus 100 includes housing 111. A maintenance opening (not shown) is provided at the lower front side of the housing 111. A pair of front maintenance doors 104, which may be opened and close the maintenance opening, are provided at the maintenance opening. A pod (substrate container) 110 accommodates wafers (substrates) 200 such as silicon wafers. The pod 110 is used as carrier for loading the wafers 200 into the housing 111 or unloading the wafers 200 from the housing 111.

A pod loading/unloading port (not shown) is provided at front wall of the housing 111 for loading and unloading the pod 110 into and from the housing 111. A loading shelf 114 is provided at the pod loading/unloading port. The pod 110 is aligned while placed on the loading shelf 114.

A rotatable pod shelf 105 is provided over the substantially center portion of the housing 111. The rotatable pod shelf 105 may hold plurality of pods 110. The rotatable pod shelf 105 includes vertical column (not shown) capable of rotating horizontally and plurality of shelf plates (not shown) are provided at the upper end portion, the mid portion and lower end portion of the vertical column.

A pod transport device 118 is provided between the loading shelf 114 and the rotatable pod shelf 105 in the housing 111. The pod transport device 118 includes pod elevator 118a capable of elevating while supporting the pod 110 and pod transport mechanism 118b. The pod transport device 118 transports the pod 110 among the loading shelf 114, the rotatable pod shelf 105 and pod opener 121 by consecutive operations of the pod elevator 118a and the pod transport mechanism 118b.

A sub-housing 119 is provided below the substantially center portion in the housing 111 toward the rear end of the housing 111. A pair of pod opener 121 is provided at front wall of the sub-housing 119. The pod opener 121 is configured to transport the wafers 200 into or out of the sub-housing 119.

The pod opener 121 includes support (not shown) on which the pod 110 is placed and cap opener 123 for detaching cap of the pod 110. When the cap of the pod 110 placed on the support (not shown) is detached by the cap opener 123, the wafer entrance of the pod 110 is opened.

The sub-housing 119 defines transfer chamber 124 fluidically isolated from the space in which the pod transport device 118 or the rotatable pod shelf 105 is provided. A wafer transport mechanism 125 is provided in the front portion of the transfer chamber 124. The wafer transport mechanism 125 is also referred to as substrate transport mechanism 125. The substrate transport mechanism 125 includes wafer transport apparatus 125a and wafer transport apparatus elevator 125b. The wafer transport apparatus 125a and the wafer transport apparatus elevator 125b are also referred to as substrate transport apparatus 125a and substrate transport apparatus elevating mechanism 125b, respectively. The substrate transport apparatus 125a horizontally rotates or moves the wafer 200. The substrate transport apparatus elevator 125b ascends and descends the substrate transport apparatus 125a. The substrate transport apparatus 125a may further includes tweezers (not shown) capable of supporting the wafer 200. The substrate transport mechanism 125 may charge or discharge the wafer 200 into or from the boat 217 by consecutive operations of the substrate transport apparatus elevator 125b and the substrate transport apparatus 125a. The boat 217 is also referred to as substrate retainer 217.

Figure 2:
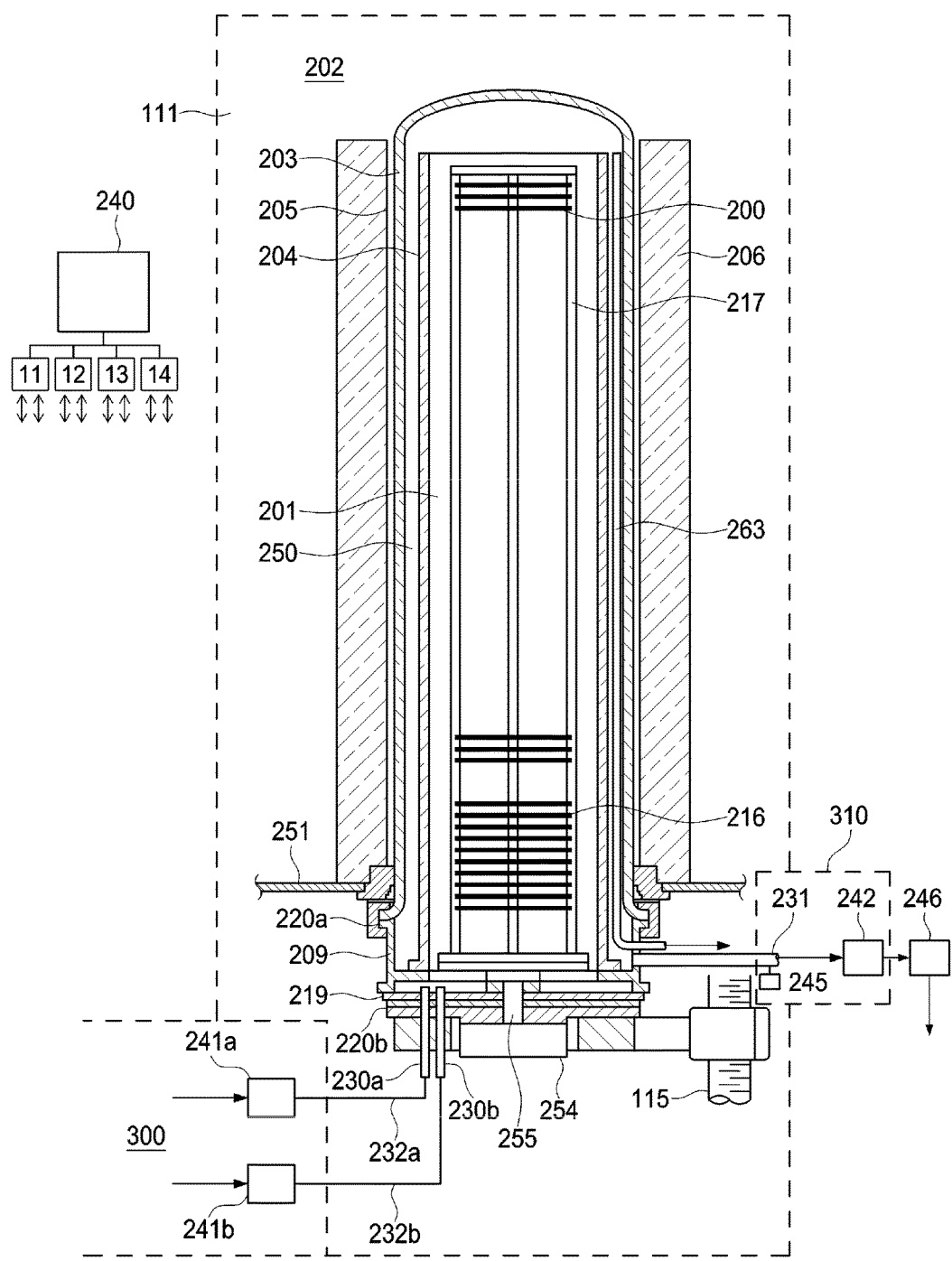
FIG. 2 schematically illustrates vertical cross-section of processing furnace of the substrate processing apparatus according to the embodiment.

As shown in FIGS. 1 and 2, boat elevator 115 is provided in the sub-housing 119. In other words, the boat elevator 115 is provided in the sub-housing 119 (transfer chamber 124). The boat elevator 115 elevates the boat 217. An arm (not shown) is connected to an elevating table (not shown) of the boat elevator 115. A seal cap (also referred to as "lid") 219 is provided horizontally at the arm. The lid 219 may support the boat 217 vertically and close the lower end of processing furnace 202.

A transfer mechanism according to the embodiment includes the rotatable pod shelf 105, the boat elevator 115, the pod transport device 118, the substrate transport mechanism 125, the boat 217 and the rotating mechanism 254. The rotatable pod shelf 105, the boat elevator 115, the pod transport device 118, the substrate transport mechanism 125, the boat 217 and the rotating mechanism 254 are electrically connected to a transfer controller 11.

As shown in FIG. 1, the processing furnace 202 is provided above standby space 126 where the boat 217 is accommodated and in standby.

As shown in FIG. 1, clean unit 134 provided at the left end portion of the left side of the transfer chamber 124 opposite to the boat elevator 115 and the wafer transport apparatus elevator 125b. The clean unit 134 is configured to supply clean air 133 such as an inert gas and clean atmosphere.

The clean air 133 ejected from the clean unit 134 flows around the wafer transport apparatus 125a and the boat 217 accommodated in and the standby space 126. Thereafter, the clean air 133 is exhausted from the housing 111 through a duct (not shown) or circulated back to the primary side (supply side) of the clean unit 134, and then ejected again into the transfer chamber 124.

A plurality of covers (not shown) which are the entrances for entering the substrate processing apparatus 100 are provided on the outer surface of the housing 111 and the sub-housing 119. The covers may be removed during maintenance such that a repair personnel may access the substrate processing apparatus 100. A door switch 130, which is an access sensor, is provided at the end portion of the housing 111 and the sub-housing 119 facing the covers. A substrate detecting sensor 140 for detecting whether the pod 110 is placed on the loading shelf 114 is provided at the loading shelf 114. The door switch 130 and the substrate detecting sensor 140 are electrically connected to a controller as an apparatus controller 240 configured to control operation of the substrate processing apparatus 100 described below.

As shown in FIG. 2, the substrate processing apparatus 100 includes at least the housing 11, gas supply unit (gas box) 300 and an exhaust unit (exhaust box) 310. A gas exhaust mechanism (not shown) is provided in the exhaust unit 310. The gas exhaust mechanism includes an exhaust pipe 231, pressure sensor (pressure detector) 245 and pressure adjusting unit 242 such as an APC (Automatic Pressure Controller) valve.

A process gas supply system includes process gas source (not shown), an opening/closing valve (not shown), mass flow controller (MFC) (gas flow rate controller) 241a and process gas supply pipe 232a. purge gas supply system includes purge gas source (not shown), an opening/closing valve (not shown), an MFC 241b and purge gas supply pipe 232b. The process gas supply system and the purge gas supply system are provided in the gas supply unit 300.

As shown in FIG. 2, an exhaust device (also referred to as "auxiliary pump") 246 is connected to the exhaust unit 310. The substrate processing apparatus 100 may further includes the auxiliary pump 246. The exhaust device 246 will be described later in detail.

As shown in FIG. 2, the controller 240 is electrically connected to the transfer controller 11, temperature controller 12, pressure controller 13 and gas supply controller 14.

(2) Configuration of Process Furnace

As shown in FIG. 2, the processing furnace 202 includes reaction tube (process tube) 203. The reaction tube 203 includes an inner reaction tube (inner tube) 204, an outer reaction tube (outer tube) 205 provided outside the inner reaction tube 204. The inner reaction tube 204 is cylindrical with open upper and lower ends. A process chamber 201 wherein the wafers are processed is provided in hollow portion of the inner reaction tube 204. The process chamber 201 is configured to accommodate the boat 217.

The heater 206 is provided at the outside of the reaction tube 203 to surround the side walls of the reaction tube 203. The heater 206 is cylindrical. The heater 206 is vertically supported by heater base (support plate) 251.

A manifold as furnace opening 209 is provided under the outer reaction tube 205. The reaction tube 205 and the furnace opening 209 are concentrically arranged. The furnace opening 209 is cylindrical with open upper and lower ends. The furnace opening 209 vertically supports the lower ends of the inner reaction tube 204 and the lower ends of the outer reaction tube 205. The furnace opening 209 engages with the lower ends of the inner reaction tube 204 and the lower ends of the outer reaction tube 205. A sealing member such as an O-ring 220a is provided between the furnace opening 209 and the outer reaction tube 205. The reaction tube 203 is vertically supported by the support plate 251 under the furnace opening 209. A reaction vessel is constituted by the reaction tube 203 and the furnace opening 209.

A process gas nozzle 230a and purge gas nozzle 230b are connected to the furnace opening 209 to communicate with the process chamber 201. The process gas supply pipe 232a is connected to the process gas nozzle 230a. Components such as the process gas source (not shown) are connected to the upstream side of the process gas supply pipe 232a through the MFC 241a. The purge gas supply pipe 232b is connected to the purge gas nozzle 230b. Components such as the purge gas source (not shown) are connected to the upstream side of the purge gas supply pipe 232b through the MFC 241b.

The process gas supply system according to the embodiment includes the process gas source (not shown), the opening/closing valve (not shown), the MFC 241a, the process gas supply pipe 232a and the process gas nozzle 230a. The purge gas supply system according to the embodiment mainly includes the purge gas source (not shown), the opening/closing valve (not shown), the MFC 241b, the purge gas supply pipe 232b and the purge gas nozzle 230b. The gas supply system according to the embodiment mainly includes the process gas supply system and the purge gas supply system. The gas supply controller 14 is electrically connected to the MFCs 241a and 241b.

The exhaust pipe 231 for exhausting the inner atmosphere of the process chamber 201 is provided at the furnace opening 209. The exhaust pipe 231 is disposed at the lower end of an annular space 250 which is gap between the inner reaction tube 204 and the outer reaction tube 205. The exhaust pipe 231 is spatially connected to the annular space 250. The pressure sensor 245, the pressure adjusting unit 242 and the exhaust device 246 are sequentially installed at the exhaust pipe 231 from the upstream side to the downstream side of the exhaust pipe 231. The pressure controller 13 is electrically connected to the pressure adjusting unit 242 and the pressure sensor 245.

The lid 219 capable of sealing the furnace opening 209 in airtight manner is provided under the furnace opening 209. The lid 219 is disk-shaped. An O-ring 220b, serving as sealing member and being in contact with the lower end of the furnace opening 209, is provided on the upper surface of the lid 219.

The rotating mechanism 254 configured to rotate the boat 217 is provided about the center portion of the lid 219 opposite to the process chamber 201. A rotating shaft 255 of the rotating mechanism 267 is connected to the boat 217 through the lid 219 and supports the boat 217 from thereunder. As the rotating mechanism 254 rotates the boat 217 with the wafers 200 are rotated.

The lid 219 may be moved upward/downward in the vertical direction by the boat elevator 115 installed outside the reaction tube 203. When the lid 219 is moved upward/downward by the boat elevator 115, the boat 217 may be loaded into the process chamber 201 or unloaded out of the process chamber 201. The transfer controller 11 is electrically connected to the rotating mechanism 254 and the boat elevator 115.

The boat 217 supports plurality of wafers 200 which are concentrically arranged in the vertical direction and in horizontally orientation. The boat 217 is made of heat-resistant material such as quartz and silicon carbide (SiC). Insulating plate 216 serving as an insulating member is provided in multi-stages under the boat 217. The insulating plate 216 is made of heat-resistant material such as quartz and SiC and is disk-shaped. The insulating plate 218 suppresses the transmission of heat from the heater 206 to the lid 219.

A temperature sensor (temperature detector) 263 is provided in the reaction tube 203. A heating mechanism according to the embodiment is constituted by the heater 206 and the temperature sensor 263. The temperature controller 12 is electrically connected to the heater 206 and the temperature sensor 263.

Next, the exhaust device 246 will be described with reference to FIG. 10. According to the embodiment, the exhaust device 246 is installed in upright orientation. The exhaust device 246 includes, for example, a mechanical booster pump capable of evacuating the process chamber 201 to a high vacuum. Herein, "installed in upright orientation" means that a pump is installed in vertical orientation. When the pump is installed in upright orientation, the footprint is reduced.

The exhaust device 246 has a vertically elongated shape, and includes a shaft 2 which extends vertically. A motor 8 for driving the shaft 2 and a monitoring unit 9 are installed above the body. In order to install the exhaust device 246 securely, it is preferable to maintain the center of gravity of the exhaust device 246 as low as possible. The exhaust device 246 includes anti-vibration means such as rubber on its underside, and is installed perpendicular to the floor. To reduce the footprint, the body including the shaft 2 and the rotor 4, the motor 8 and the monitoring unit 9 have approximately the same width.

The exhaust device 246 is connected to a connecting pipe 330 including an exhaust pipe. The exhaust device 246 includes an intake pipe 1 for taking in a gas, an exhaust pipe 3 for exhausting the gas, the motor 8 for rotating the shaft 2, and the monitoring unit 9 for controlling the motor 8. The gas flow channel 10 is provided between the intake pipe 1 and the body, between the exhaust pipe 3 and the body, and around the contacting portion of the shaft 2 and the rotor 4, respectively. The gas introduced through the intake pipe 1 passes through the flow channel 10 and is then discharged through the exhaust pipe 3.

The rotor 4 is supported by the shaft 2. The rotor 4 is rotated by the shaft 2 driven by the motor 8. The gas taken in through the intake pipe 1 provided at the upper portion of the body flows through the flow channel 10 by the rotation of the rotor 4 toward the exhaust pipe 3. The exhaust capability of the exhaust device 246 is maximized by the intake pipe 1 provided at the upper portion of the body to shorten the length of the connecting pipe 330. The length of the pipe from the exhaust device 246 to the main pump 247 on another floor in the factory may be reduced by the exhaust pipe 3 provided at the lower portion of the body.

A gate valve GV may be provided at the intake pipe 1. When the gate valve GV is provided at the intake pipe 1, the danger that may be present during maintenance may be prevented by closing the gate valve GV during an exhaust of harmful gases from the exhaust pipe 3 such as HCl reactive with air and moisture.

(3) Operation of Substrate Processing Apparatus

Next, the operation of the substrate processing apparatus 100 will be described with reference to FIGS. 1 and 2 based on an exemplary sequence of forming film on the wafer 200, which is one of substrate processing for manufacturing semiconductor device. In the description below, the controller 240 controls the operations of the components of the substrate processing apparatus 100.

As shown in FIG. 1, when the pod 110 is placed on the loading shelf 114 by an in-step transfer apparatus (not shown), the pod 110 is detected by the substrate detecting sensor 140 and front shutter (not shown) is opened to expose the pod loading/unloading port (not shown). The pod 110 placed on the loading shelf 114 is transported into the housing 111 through the pod loading/unloading port by the pod transport device 118.

The pod 110 transported into the housing 111 is automatically transported to and temporarily stored in the designated shelf plate of the rotatable pod shelf 105 by the pod transport device 118. Thereafter, the pod 110 is transported to the support of the pod opener 121 from the designated shelf plate. Alternately, the pod 110 transported into the housing 111 may be transported directly to the support of the pod opener 121 by the pod transport device 118.

The cap opener 123 detaches the cap of the pod 110 placed on the support of the pod opener 121. The wafer entrance of the pod 110 placed on the support of the pod opener 121 is opened. The wafer 200 is then transported out of the pod 110 by the tweezers (not shown) of the substrate transport apparatus 125a through the wafer entrance, aligned by notch alignment device (not shown), transported into the standby space 126 behind the transfer chamber 124, and charged into the boat 217 (wafer charging). The substrate transport apparatus 125a then returns to the pod 110 and transports the next wafer 200 from the pod 110 into the boat 217.

While the substrate transport mechanism 125 loads the wafer 200 from one of the upper pod opener 121 and the lower pod opener 121 into the boat 217, another pod 110 is transported by the pod transport device 118 from rotatable pod shelf 105 to the other one of the upper pod opener 121 and the lower pod opener 121, and opened.

When a predetermined number of wafers 200 are charged into the boat 217, furnace opening shutter (not shown) is opened to expose the lower end of the processing furnace 202. The lid 219 is elevated by the boat elevator 115 and the boat 217 charged with the wafers 200 is loaded into the processing furnace 202.

After the boat 217 accommodated the wafers 200 is loaded into the processing furnace 202, the lid 219 seals the lower end of the furnace opening 209 via the O-ring 220b.

The exhaust device 246 vacuum-exhausts the process chamber 201 such that the inner pressure of the process chamber 201 is at desired pressure (vacuum level). At this time, the inner pressure of the process chamber 201 is measured by the pressure sensor 245, and the pressure adjusting unit 242 is feedback-controlled based on the measured pressure. That is, the opening degree of the an APC valve of the pressure adjusting unit 242 is feedback-controlled. The heater 206 heats the process chamber 201 such that the temperature of the wafers 200 in the process chamber 201 reaches and is maintained at desired temperature. The energization state of the heater 206 is feedback-controlled based on the temperature detected by the temperature sensor 263. Thereafter, the boat 217 and the wafers 200 are rotated by the rotating mechanism 254.

Next, process gas is supplied from the process gas source (not shown). The process gas having the flow rate thereof adjusted by the MFC 241a is supplied into the process chamber 201 through the process gas supply pipe 232a and the process gas nozzle 230a. The process gas supplied into the process chamber 201 rises in the process chamber 201 and flows into the annular space 250 through the opening at the upper end of the inner tube 204 and is exhausted through the exhaust pipe 231. The process gas contacts the surface of the wafer 200 as it passes through the process chamber 201 whereby the thin film is deposited on the surface of the wafer 200 by thermal reaction.

When predetermined processing time elapses, purge gas is supplied from the purge gas source (not shown). The purge gas having the flow rate thereof adjusted by the MFC 241b is supplied into the process chamber 201. The inner atmosphere of the process chamber 201 is replaced with the inert gas, and the inner pressure of the process chamber 201 is returned to normal pressure.

Thereafter, the lid 219 is lowered by the boat elevator 115 and the lower end of the furnace opening 209 is opened. The processed wafer 200 is transported out of the reaction tube 203 through the lower end of the furnace opening 209 while being supported by the boat 217 (boat unloading). The processed wafer 200 is then discharged from the boat 217 and stored in the pod 110 (wafer discharging).

After the wafers are discharged, the pod 110 accommodating the processed wafers 200 is unloaded from the housing 111 in the order reverse to that described above except for the aligning process of the wafers 200 by the notch alignment device (not shown).

(4) Configuration of the Controller

Figure 3:
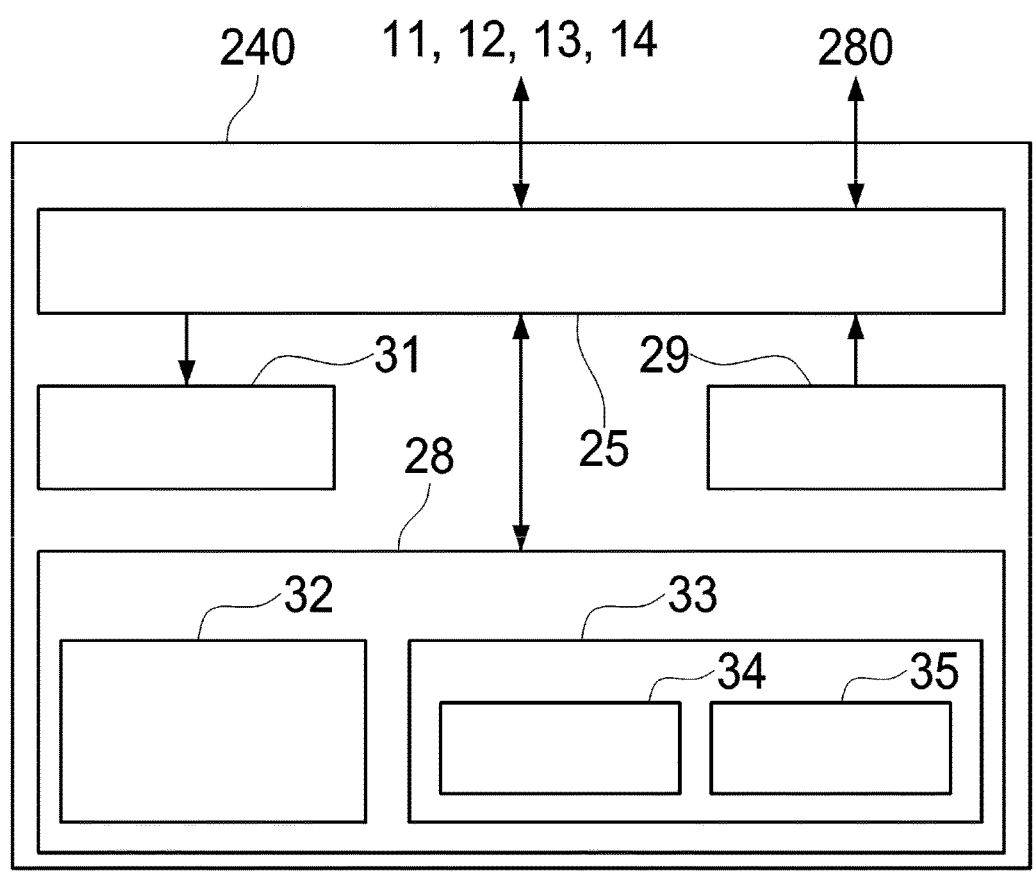
FIG. 3 schematically illustrates controller of the substrate processing apparatus according to the embodiment.

The controller 240 for controlling the substrate processing 100 will be described with reference to FIG. 3.

The controller 240 includes an arithmetic controller such as CPU (Central Processing Unit) 25, memory unit having such as memory (ROM) 35 that also functions as a hard disk drive (HDD) and such as memory (RAM), and an input unit 29 such as mouse and keyboard and a display unit 31 such as monitor. Incidentally, the CPU 25, the memory unit, the input unit 29, and the display unit 31 constitute an operation unit capable of setting respective data.

The CPU 25 forms the backbone of the controller 240. The CPU 25 is configured to execute a control program stored in the ROM 35 and a recipe stored in the storage unit 28 functioning as a recipe storage unit according to an instruction from the display unit 31. The ROM 35 is a recording medium for storing data such as an operating system for the CPU 25, and may be embodied by components such as an EEPROM, a flash memory and a hard disk. The memory (RAM) functions as a work area (temporary storage unit) of the CPU 25.

Herein, "substrate processing recipe" refers to a recipe in which information such as processing conditions and processing sequences for processing the wafer 200 is stored. Information such as a pre-set value (control value) or a transmission timing to be transmitted to components such as the transfer controller 11, the temperature controller 12, the pressure controller 13 and the gas supply controller 14 is stored in the recipe.

The CPU 25 is configured to control parameters such as the inner temperature and the inner pressure of the processing furnace 202 and the flow rate of the process gas supplied into the processing furnace 202 in order to process the wafer 200 loaded in the processing furnace 202.

The transfer controller 11 is configured to control the operation of the transfer mechanism configured to transport the substrate such as the rotatable pod shelf 105, the boat elevator 115, the pod transport device 118, the substrate transport mechanism 125 and the rotating mechanism 254. Each of the rotatable pod shelf 105, the boat elevator 115, the pod transport device 118, the substrate transport mechanism 125, the boat 217 and the rotating mechanism 254 includes a sensor (not shown). The transfer controller 11 is configured to notify the controller 240 of the values detected by the sensors when a predetermined value and an abnormal value are detected by the sensors.

The storage unit 28 has a data storage area 32 where various data are stored and a program storage area 33 where various programs such as the substrate processing recipe are stored.

Various parameters related to the recipe file are stored in the data storage area 32. The various programs such as the substrate processing recipe required when controlling the operation of the substrate processing apparatus 100 are stored in the program storage area 33.

A touch panel is provided in the display unit 31 of the controller 240. The touch panel is configured to receive an operation command for operating the substrate transfer system and the substrate processing system when a screen is displayed. The operating unit preferably includes at least the display unit 31 and the input unit 29 as in operating terminal device such as a computer and a mobile terminal device.

The temperature controller 12 is configured to adjust the inner temperature of the processing furnace 202 by controlling the temperature of the heater 206 of the processing furnace 202. The temperature controller 12 is also configured to notify the controller 240 of the values detected by the temperature sensor 263 when a predetermined value and an abnormal value are detected by the temperature sensor 263.

The pressure controller 13 is configured to control the pressure adjusting unit 242 based on the pressure detected by the pressure sensor 245 such that the inner pressure of the process chamber 201 is at desired pressure at desired timing. The controller 240 is also configured to notify the controller 240 of the values detected by the pressure sensor 245 when a predetermined value and an abnormal value are detected by the pressure sensor 245.

The gas supply controller 14 is configured to control the MFCs 241a and 241b such that the flow rate of gas supplied into the process chamber 201 is at desired flow rate at desired timing. The gas supply controller 14 is also configured to notify the controller 240 of the values detected by a sensor (not shown) when a predetermined value and an abnormal value are detected by the sensor.

(5) Configuration of Substrate Processing Apparatus

Figure 5:
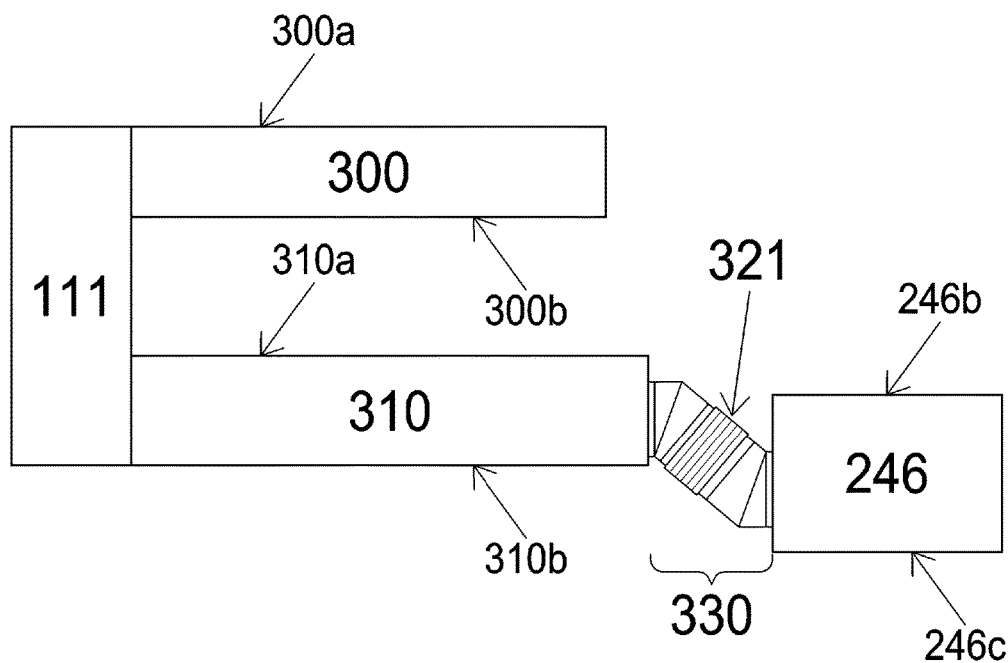
FIG. 5 schematically illustrates plane view system configuration of the substrate processing apparatus according to the embodiment.

A configuration of the substrate processing apparatus 100 according to the embodiment will be described with reference to FIGS. 5 through 9. In the present specification, as shown in FIG. 5, each of the exhaust device 246 the gas supply unit 300 and the exhaust unit 310 is provided with a first sidewall and a second sidewall opposite to the first sidewall. Also in FIG. 6 et seq., the first sidewall and the second sidewall are provided in the exhaust device 246, the gas supply unit 300 and the exhaust unit 310 in the same rules as in FIG. 5, but are omitted.

As shown in FIG. 5, the connecting pipe 330 connects the exhaust unit 310 to the exhaust device 246. Specifically, the connecting pipe 330 connects an outlet port of the exhaust unit 310 to an inlet port of the exhaust device 246. The connecting pipe 330 includes a flexible pipe 321 such as a bellows which is an absorbing member that absorbs the mechanical vibration of the exhaust device 246. The absorbing member is not limited to the bellows and the connecting pipe 330 may include other anti-vibration means capable of suppressing the transmission of the vibration to the processing furnace 202 accommodated in the housing 111. The flexible pipe 321 of the connecting pipe 330 enables the connection of the outlet port of the exhaust unit 310 to the inlet port of the exhaust device 246 where the centers of the outlet port of the exhaust unit 310 and the inlet port of the exhaust device 246 are misaligned, i.e. are not in-line. Since the exhaust device 246 is disposed on the same plane, i.e. on the same floor in the factory as the housing 111, the gas supply unit 300 and the exhaust unit 310 in the vicinity of the processing furnace 202, the exhaust capability thereof is improved. The footprint may be reduced by installing the exhaust device 246 in upright orientation. The maintenance space between the gas supply unit 300 and the exhaust unit 310 may be secured.

Figure 7A:
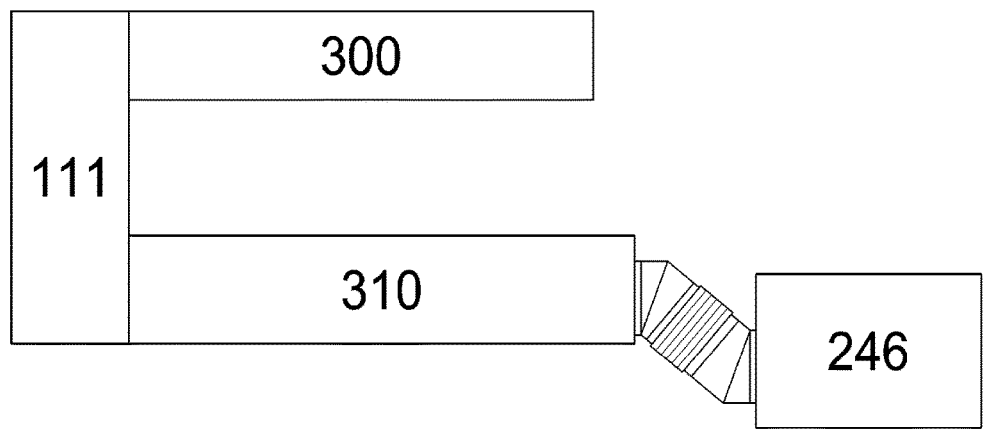
FIG. 7A and FIG. 7B schematically illustrates plane view and side view of system configuration of the substrate processing apparatus according to the embodiment, respectively.
Figure 7B:
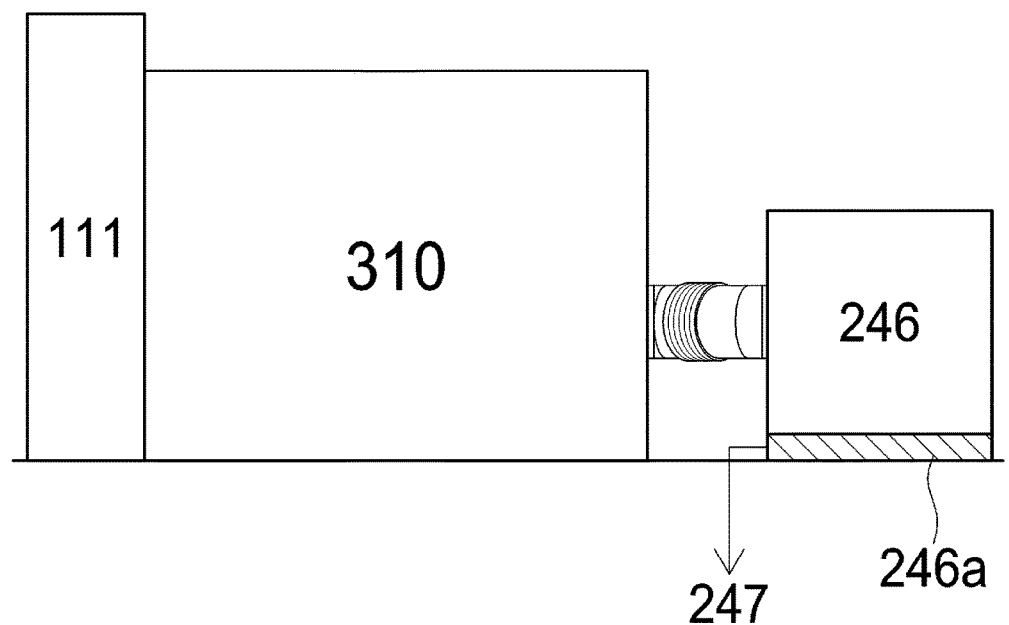

As shown in FIG. 5 and FIGS. 7a and 7b, an anti-vibration means 246a for absorbing the vibration from the exhaust device 246 is provided at the bottom of the exhaust device 246. It is preferable that the length of connecting pipe 330 is as short as possible considering the exhaust efficiency. Moreover, it is preferable that the number of bent parts at the connecting pipe 330 is minimized. Further, in order to secure the maintenance space as described above, the first sidewall 246b of the exhaust device is disposed in a space defined by extensions of the first and the second sidewall surfaces of the exhaust unit 310.

FIG. 6 is a plane view illustrating an arrangement of two or more substrate processing apparatuses 100 shown in FIG. 5 adjacent to one another. As shown in FIG. 6, the center of the inlet port of the exhaust device 246 is shifted toward the adjacent gas supply unit 300 (or outer surface of the exhaust unit 310). That is, the center of the inlet port of the exhaust device 246 is shifted toward the adjacent gas supply unit 300 so that the center of the inlet port of the exhaust device 246 and the center of the outlet port of the exhaust unit 310 are offset from each other. Here, the inner sidewall (the first side wall) 246b of the exhaust device 246 does not protrude with respect to the inner sidewall (the first side wall) 310a of the exhaust unit 310. In addition, the outer sidewall (the second side wall) 246c of the exhaust device 246 does not protrude with respect to the inner sidewall (the second side wall) 300b of the gas supply unit 300. As shown in FIG. 6, the deviation of the center of the inlet port of the exhaust device 246 is 195 mm with respect to the center of the inlet port of the exhaust unit 310, for example.

The layout among the housing 111, the exhaust unit 310, the gas supply unit 300 and the exhaust device 246 shown in FIG. 6 are specific examples and the distances in parentheses among the housing 111, the exhaust unit 310, the gas supply unit 300 and the exhaust device 246 shown in FIG. 6 are reference value only. The distance between the substrate processing apparatuses (or the housings 111) is very short, e.g., 20 mm. In other words, the distance between the outer sidewall 300a of the gas supply unit 300 and the outer sidewall 310b of the exhaust unit 310 is 20 mm. The distance between the exhaust unit 310 and the inner end of the exhaust device 246 connected by the connecting pipe 330 is 395 mm and the distance between the gas supply unit 300 and the outer end of the exhaust device 246 is 875 mm. The exhaust device 246 is disposed between an extension of the inner sidewall 310a of the exhaust unit 310 and an extension of the inner sidewall 300b of the adjacent gas supply unit 300. Thus, the outer sidewall 246b of the exhaust device 246 may protrude up to 320 mm (including a clearance of 20 mm between the two adjacent substrate processing apparatuses) with respect to the outer sidewall 310b of the exhaust unit 310. When the width of the exhaust unit 310 is 228 mm, the exhaust device 246 may be shifted within a space having a width of 548 mm. That is, it is preferable that the inner sidewall 246b of the exhaust device 246 does not protrude with respect to the inner sidewall 310a of the exhaust unit 310, and the outer sidewall 246c of the exhaust device 246 does not protrude with respect to the inner sidewall 300b of the gas supply unit 300.

Figure 16A:
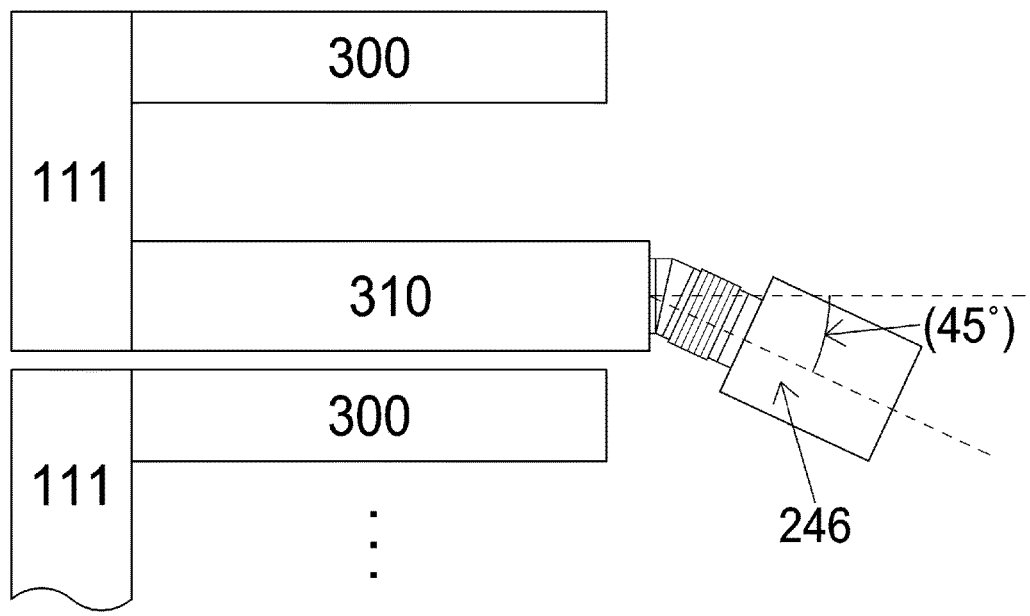
FIG. 16A schematically illustrates a first modified example of an arrangement of the substrate processing apparatus, FIG. 16B schematically illustrates a second modified example of an arrangement of the substrate processing apparatus, and FIG. 16C schematically illustrates a third modified example of an arrangement of the substrate processing apparatus.
Figure 16B:
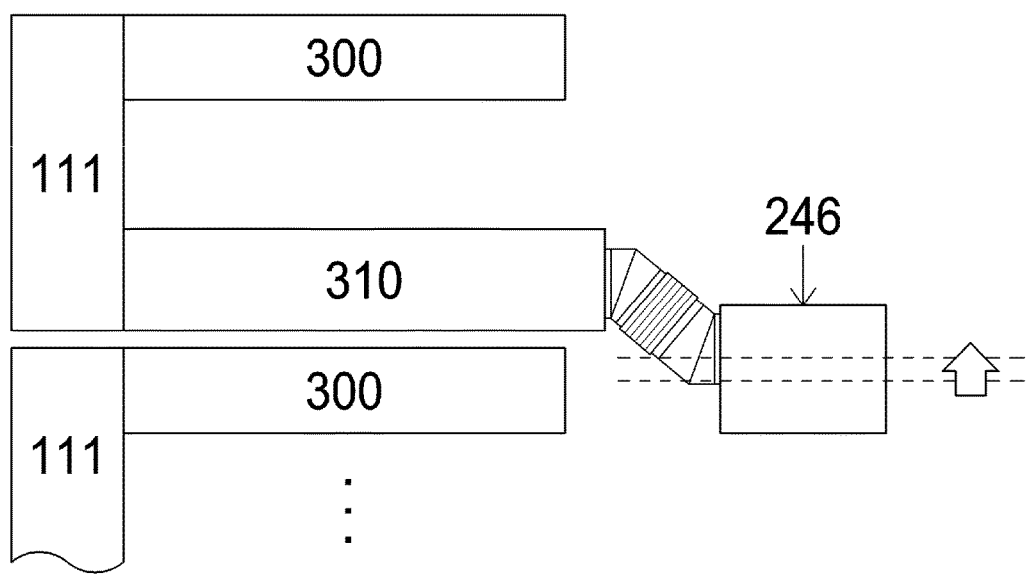
Figure 16C:
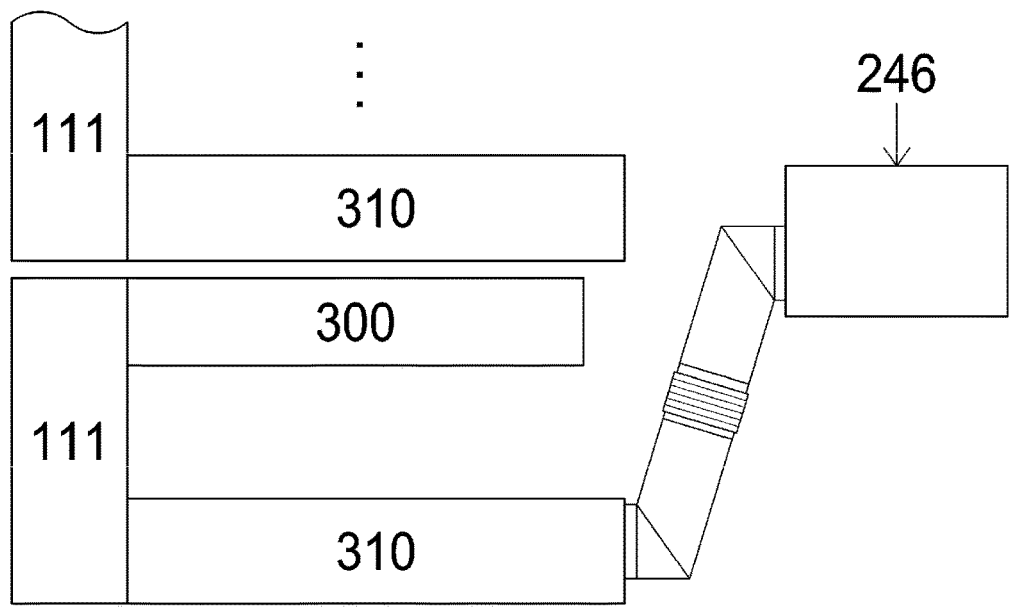

FIGS. 16A through 16C illustrate first through third modified examples of the embodiment. Referring to FIG. 16A, the exhaust device 246 is connected to the connecting pipe 330 at a predetermined angle (for example, 45 degrees) with respect to the exhaust unit 310. According to the first modified example shown in FIG. 16A, the exhaust efficiency may be improved since the length of the connecting pipe 330 is be reduced. Also, according to the first modified example shown in FIG. 16A, the exhaust device 246 is disposed in a manner that the exhaust device 246 is not in contact with the gas supply unit 300, which secures the maintenance space. According to the second modified example shown in FIG. 16B, the inlet port of the exhaust device 246 is disposed at an offset with respect to the center of the exhaust device 246. According to the second modified example shown in FIG. 16B, the exhaust efficiency may be improved since the length of the connecting pipe 330 is reduced. According to the second modified example shown in FIG. 16B, since the inner sidewall 246b of the exhaust device 246 does not protrude from the inner sidewall 310a of the exhaust unit 310, and the outer sidewall 246c of the exhaust device 246 does not protrude from the inner sidewall 300b of the gas supply unit 300, the maintenance space may be secured. FIG. 16C illustrates the third modified example wherein the last substrate processing apparatus 100 of the plurality of substrate processing apparatuses shares the exhaust device 246 of the adjacent substrate processing apparatus 100.

Figure 17A:
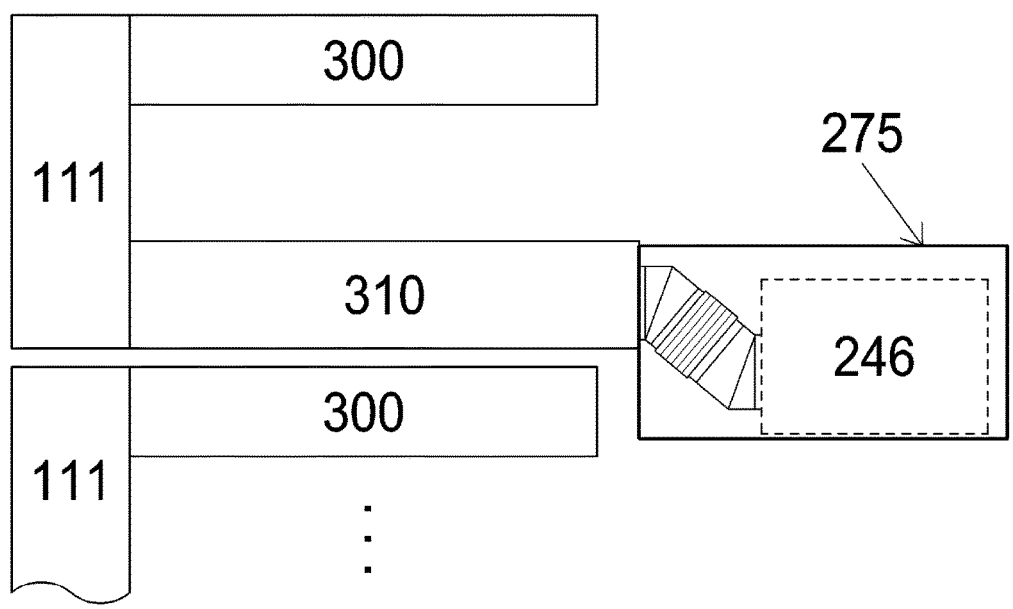
FIG. 17A illustrates a plane view of a fourth modified example of the arrangement of the substrate processing apparatus.
Figure 17B:
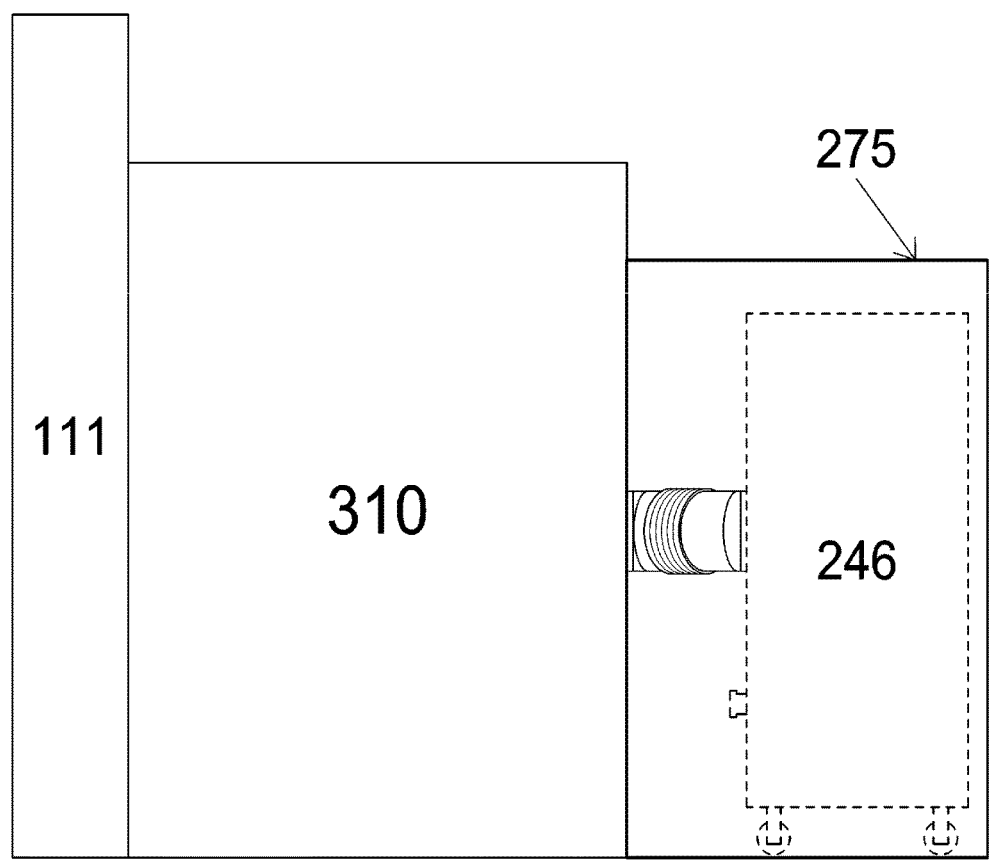
FIG. 17B illustrates a side view of the fourth modified example of the arrangement of the substrate processing apparatus.
Figure 18A:
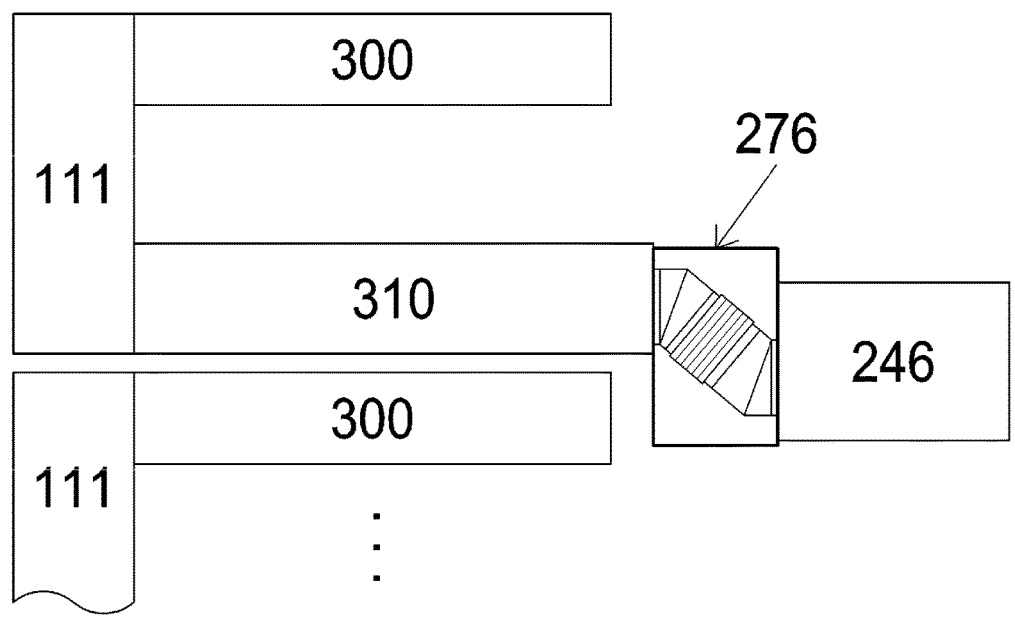
FIG. 18A schematically illustrates a plane view of a fifth modified example of an arrangement of the substrate processing apparatus, FIGS. 18B and 18C schematically illustrate side views of the fifth modified example of the arrangement of the substrate processing apparatus.
Figure 18B:
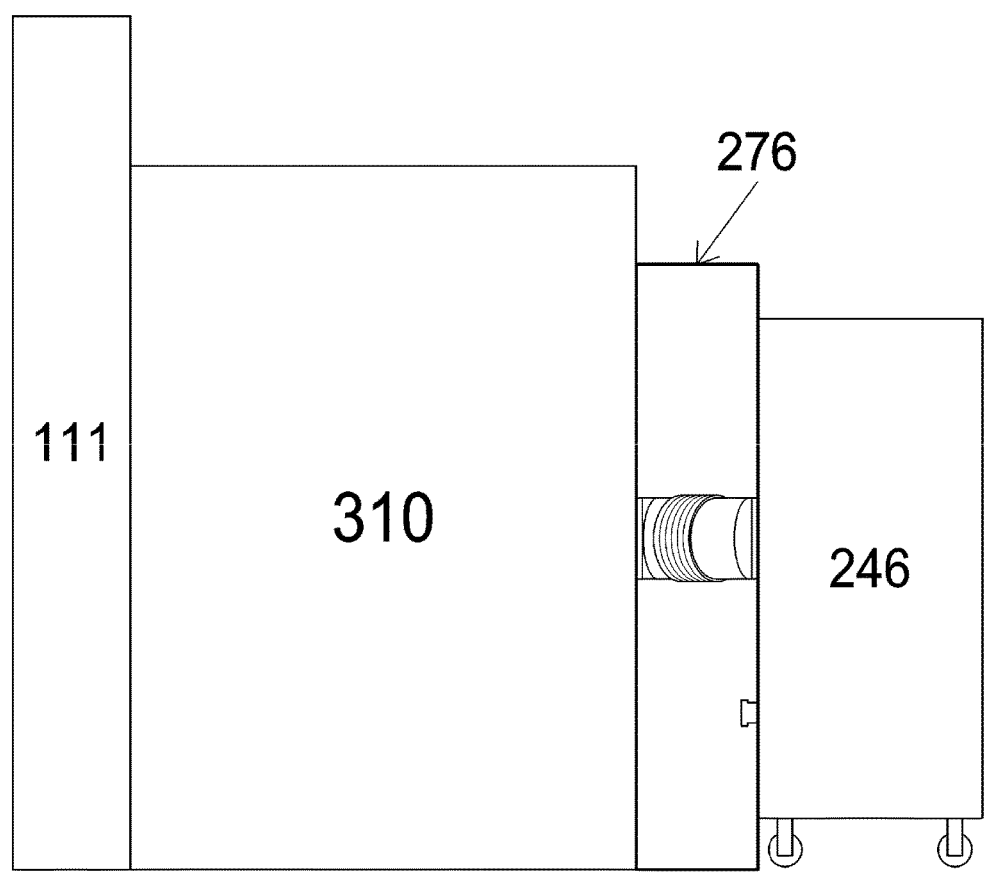
Figure 18C:
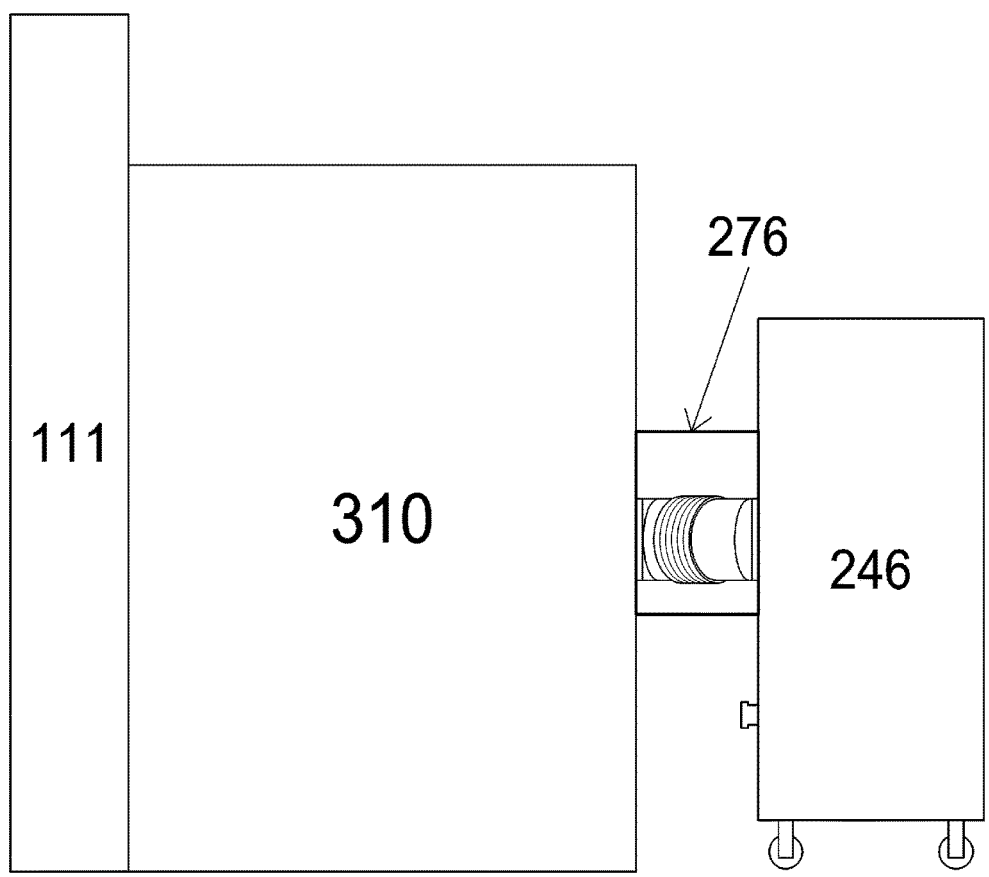

FIGS. 17A and 17B illustrate a fourth modified example of the embodiment. According to the fourth modified example shown in FIGS. 17A and 17B, a cover 275 is provided to accommodate the connecting pipe 330 and the exhaust device 246. FIGS. 18A through 18C illustrate a fifth modified example of the embodiment. According to the fifth modified example shown in FIGS. 18A through 18C, the cover 276 is provided to accommodate only the connecting pipe 330. The cover 275 and the cover 276 may reduce the noise of the exhaust device 246, which may be a mechanical booster pump.

Figure 8:
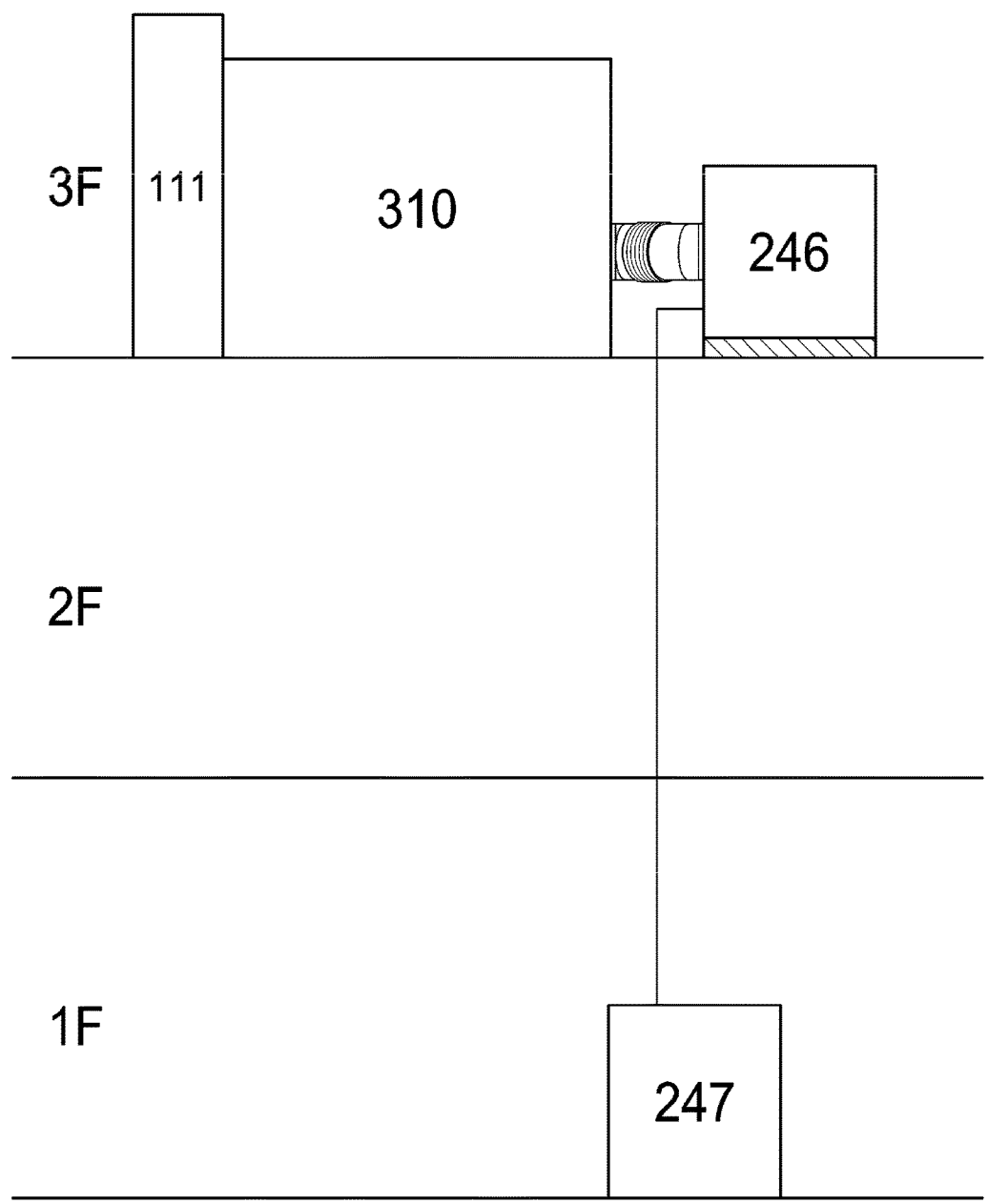
FIG. 8 schematically illustrates the system configuration of the substrate processing apparatus according to the embodiment.

As shown in FIG. 8, the main pump 247 is connected to the downstream side of the exhaust device 246. While the exhaust device 246 is installed on the same plane, i.e. on the same floor of the factory as the housing 111, the gas supply unit 300 and the exhaust unit 310, the main pump 247 is installed on a plane different from the exhaust device 246, i.e., on another floor of the factory. Accordingly, the connecting pipe 330 having a small diameter may be used to connect the exhaust unit 310 and the exhaust device (auxiliary pump) 246 such that the costs of the connecting pipe 330 and the heating unit (jacket heater) may be reduced.

Figure 9A:
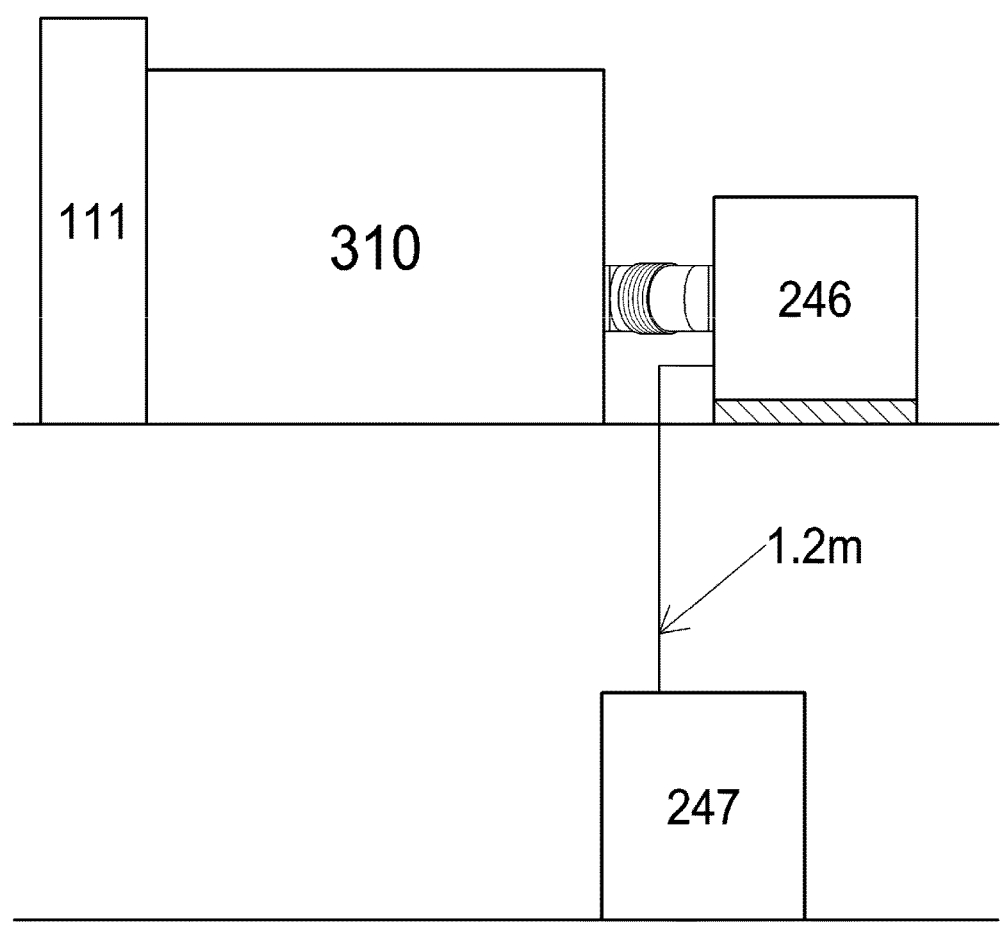
FIG. 9A and FIG. 9B schematically exemplify a configuration of exhaust pipes of the substrate processing apparatus according to the embodiment.
Figure 9B:
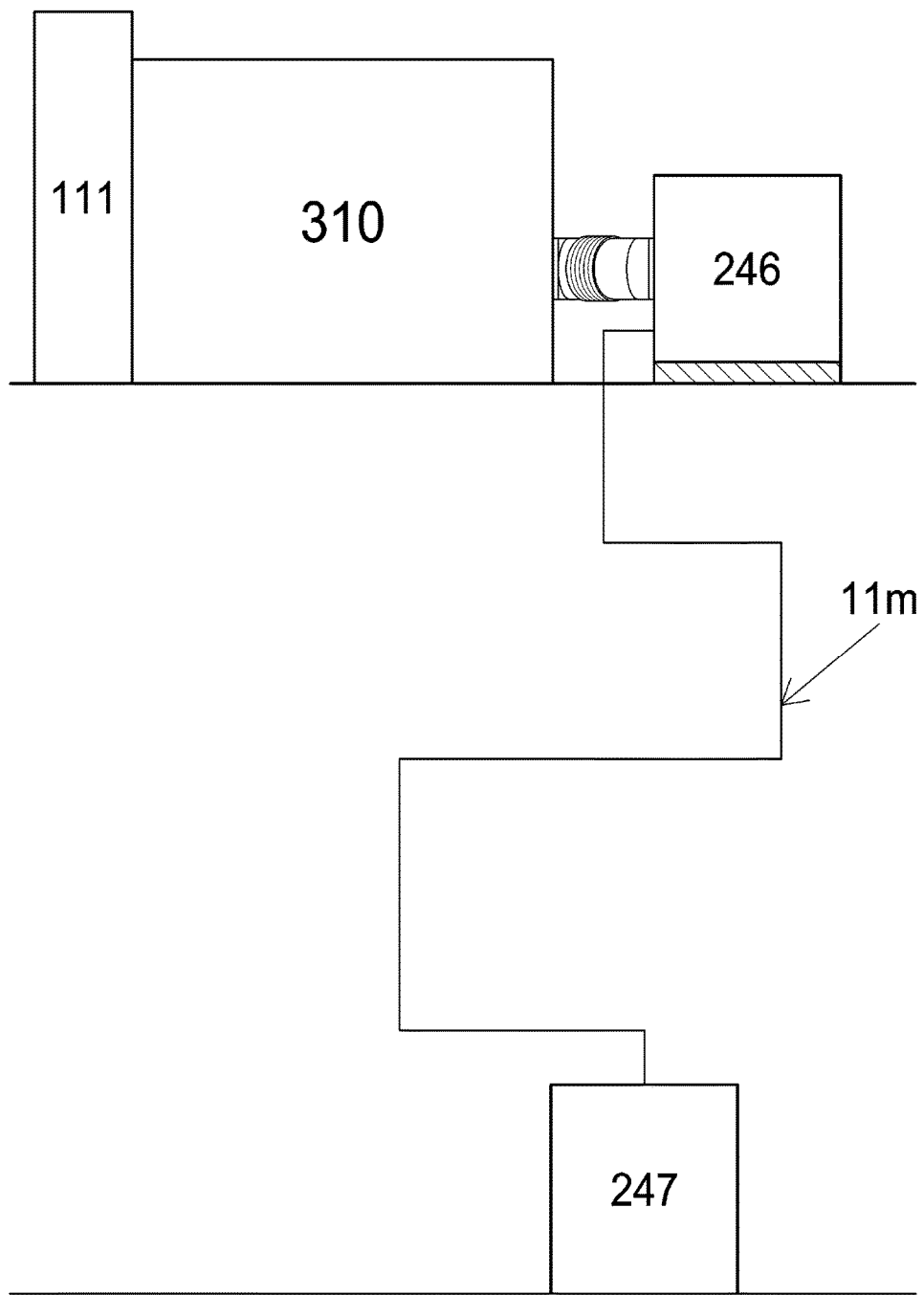

The pipe configuration between the exhaust device 246 and the main pump 247 shown in FIGS. 9A and 9B is different. In particular, the exhaust pipe connecting the exhaust device 246 and the main pump 247 shown in FIG. 9A is 1.2 m in length and includes one bent portion while the exhaust pipe connecting the exhaust device 246 and the main pump 247 shown in FIG. 9B is 11 m in length and includes seven bent portions. Despite these differences, there is no difference in the characteristics of the exhaust pipes in FIGS. 9A and 9B when exhausting the process chamber 201. That is, the exhaust characteristics when exhausting the inside of the process chamber 201 are not dependent upon the exhaust pipes connecting the exhaust device 246 and the main pump 247. The exhaust characteristics among the plurality of substrate processing apparatuses 100 installed in the semiconductor manufacturing factory do not differ from one another because of the exhaust pipes.

(6) Control System of Substrate Processing Apparatus

Figure 4:
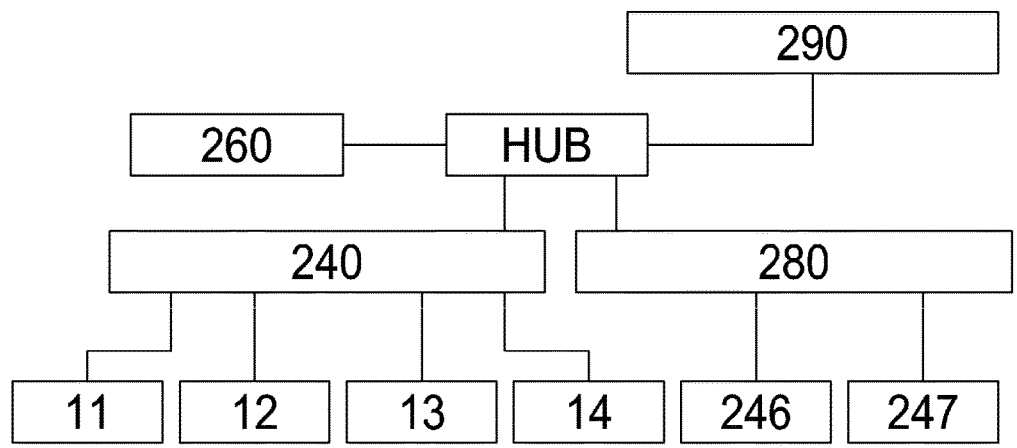
FIG. 4 schematically illustrates control system of the substrate processing apparatus according to the embodiment.

A control system of the substrate processing apparatus 100 according to the embodiment will be described with reference to FIG. 4. The control system according to the embodiment includes: a host computer 290 such as a customer's host computer; an operating unit 260 capable of exchanging data with the host computer 290, the controller 240 configured to control the operation of the substrate processing apparatus such as transporting wafer 200 using data obtained by monitoring flow rate, pressure and temperature; and a pump controller 280 configured to control the main pump 247 and the auxiliary pump 246. The components shown in FIG. 4 are connected to one another through a communication scheme such as LAN and a sensor bus.

The operation of the control system according to the embodiment will be described The controller 240 acquires various data such as the current applied to the pump from the pump controller 280 every predetermined period of time (e.g. every 100 msec), and the controller 240 transmits the acquired data to the operating unit 260.

When a certain condition is met, the operating unit 260 outputs a predetermined alarm indication to the display unit 31 and transmit an alarm message having a predetermined format to the host controller or the customer's host computer. The operator determines the state of the substrate processing apparatus 100 based on the alarm indication, and the operator of the customer company determines the state of the substrate processing apparatus 100 based on the alarm message.

Figure 11:
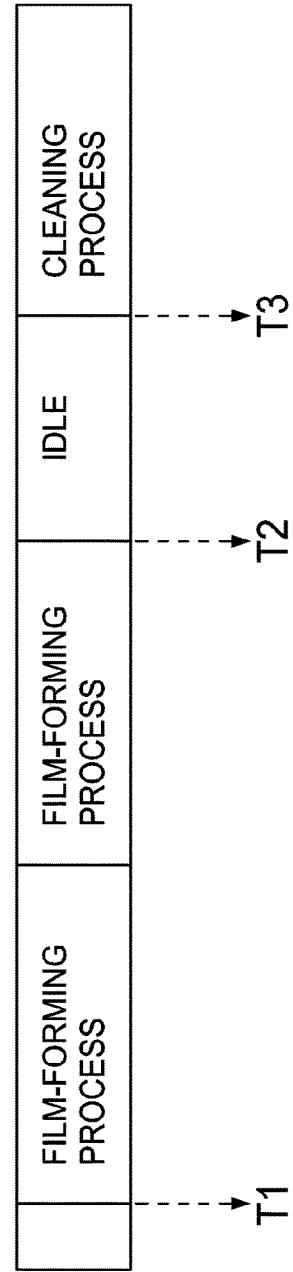
FIG. 11 illustrates substrate processing preferably performed in the substrate processing apparatus according to the embodiment.

The controller 240 is configured to control the pump controller 280 to stop the operation of or adjust the speed of the auxiliary pump 246 or the main pump 247 according to the operation state of the substrate processing apparatus 100 such as "cleaning process" and "idle" to reduce unnecessary power consumption. For example, as shown in FIG. 11, when the substrate processing apparatus 100 is in the "idle" state, the controller 240 transmits a signal to the pump controller 280 notifying the "idle" state. That is, the controller 240 transmits an instruction to stop the exhaust device 246, i.e. to turn off the auxiliary pump 246 (T2) to the pump controller 280. The controller 240 may also transmit an instruction to the pump controller 280 notifying the execution of maintenance such as a cleaning process (T3). When the substrate processing apparatus 100 transitions from the "idle" state to the "film-forming process" state, conditions such as the recovery time of the auxiliary pump 246 should be considered. The controller 240 may be configured to control the auxiliary pump 246 to operate at a timing (e.g., T1) that does not affect the film-forming process such that production is not delayed due to the standby time to reach the target pressure.

The operation of the pump may be stopped by an interlock during the film-forming process. When the operation of the pump stops, the wafer 200 being processed becomes defective, resulting in financial damage. In order to prevent this, it is preferable to continue the film-forming process when the error is moderate (medium) or minor. At the completion of the film-forming process, the substrate processing apparatus 100 is put in the standby state ("next lot reserved") without starting the film-forming process for the next lot. After the error is resolved by the maintenance of faulty parts, the film-forming process for the next lot may be started. When the error is severe, the pump controller 280 is configured to stop the operation of the pump for safety reasons. The pump controller 280 is further configured to determine whether to stop the operation of the pump when the error is moderate or minor.

Figure 12:
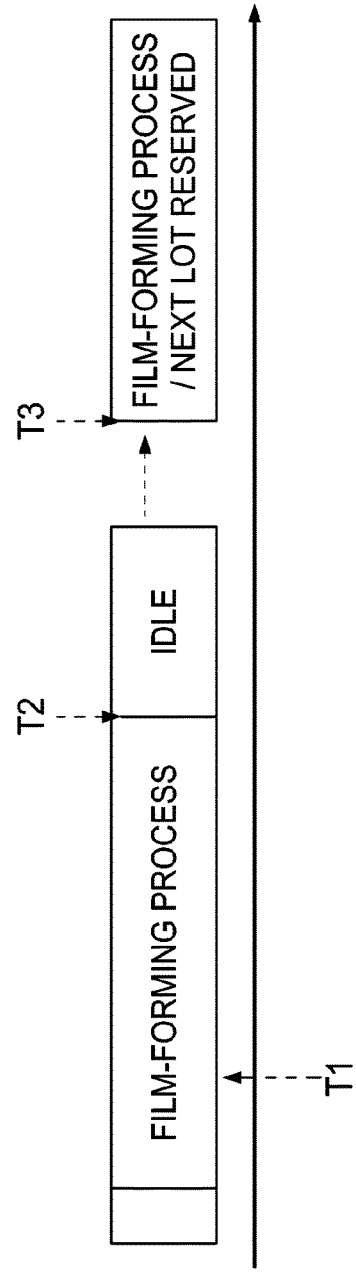
FIG. 12 schematically illustrates an error processing performed in the substrate processing apparatus according to the embodiment.

As shown in FIG. 12, when moderate or minor error (T1) occurs in the auxiliary pump 246 or the main pump 247, the film-forming process may be delayed, or the precision of the film-forming process may be degraded by deviation in pressure. Even in such case, the probability of a lot defect by continuing the operation of the auxiliary pump 246 or the main pump 247 rather than stopping the operation immediately. An alarm indicating a moderate or minor error triggers the substrate processing apparatus to be in "ready for next lot" state (T2), and user such as the operator or an on-line operator may determine the state such that the continuous production of the defective lot is avoided and limit the damage. The controller 240 is configured to releases the standby state according to the instruction from the user, and resume the film-forming process or reserve the film-forming process of the next lot (T3).

According to the embodiment, a current applied to the pump (hereinafter also referred to as "pump current") in various operation states of the substrate processing apparatus, such as during start-up state, standby state, in-production state, under-maintenance state and test state, is continuously monitored. For example, the controller 240 is configured to detect the peak value of the pump current every 100 msec using a program. Simultaneously, the fluctuation of the load when the gas is supplied into the substrate processing apparatus 100 is monitored by the controller 240. When the peak value is determined to be due to a supply of gas, the controller 240 does not issue an alarm because it is not an error. When the peak value is determined to be due to an attachment of undesired substances, the controller 240 counts the peak value of the pump current, and notifies the display unit 31 or the host controller of the peak value. As a result, an unexpected pump error may be detected, and the pump may go through maintain before the pump stops operating.

Figures 13A, 13B:
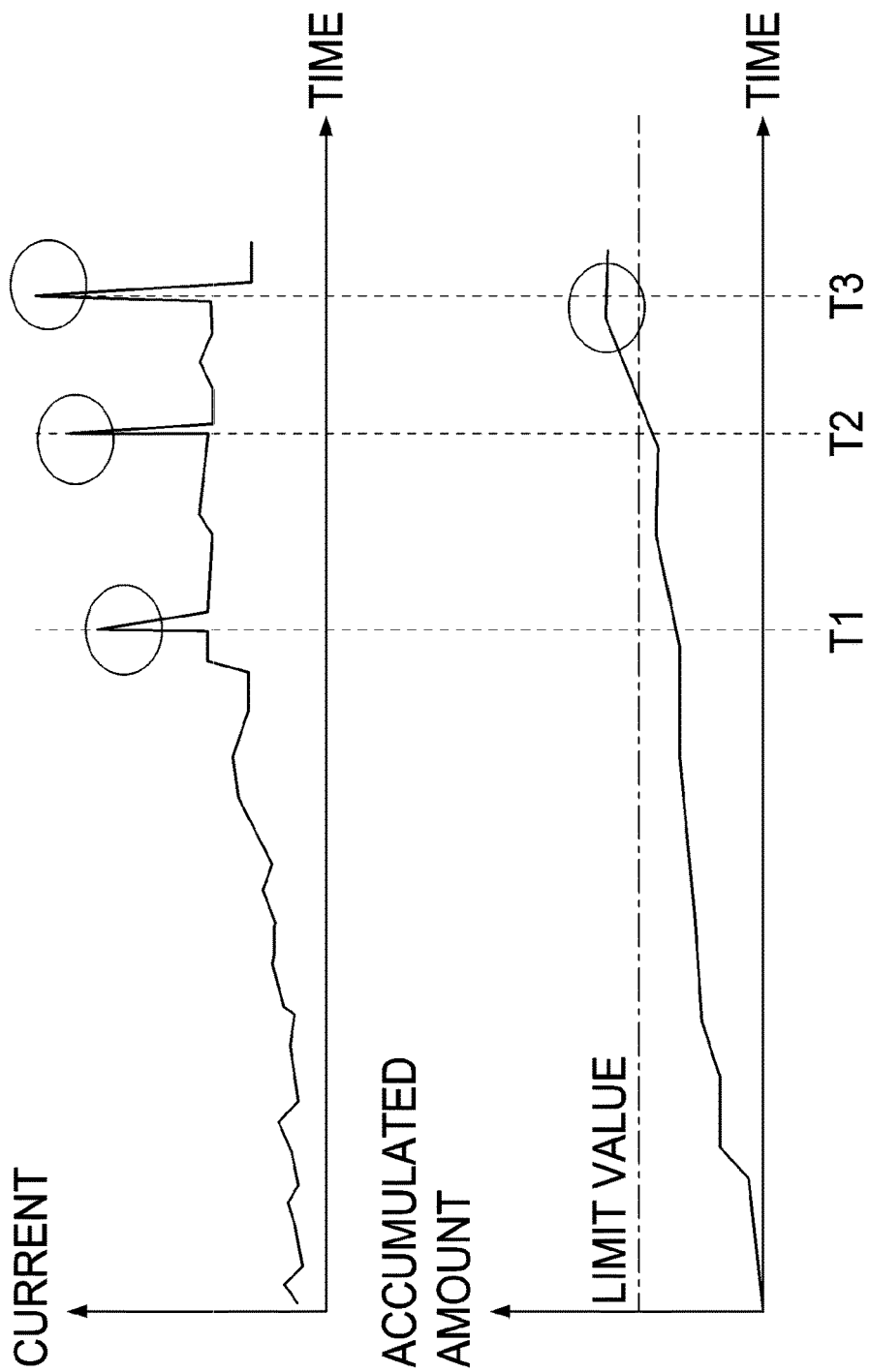
FIG. 13A and FIG. 13B are graphs illustrating value of current applied to pump and accumulated amount of gas supplied by the pump, respectively, to be used for determining maintenance of the substrate processing apparatus according to the embodiment.

As shown in FIG. 13, the peak value of the pump current at T1 or T2 is detected. However, the controller 240 does not issue an alarm because the accumulated amount of gas does not exceed a limit value. When the peak value of the pump current is detected at T3, the controller 240 is configured to issue an alarm indicating an error has occurred because the accumulated amount of the gas exceeds the limit value.

According to the embodiment, the pump system uses various energy and resources such as electrical power, water, and $N_2$ gas. For example, the energy consumed by the pump is optimized depending on the state of the substrate processing apparatus such as reducing the electrical power supplied to the pump when the substrate processing apparatus is in the standby state. Also, energy and resources may be saved by controlling the pump system in precision by considering the recovery time such that the start of the film-forming process is not delayed (so that the production rate is not degraded).

According to the embodiment, when the error is detected in the pump system, the error is classified into "severe error" which requires an emergency stop, "moderate error" and "minor error". For moderate and minor errors, the pump will continue to operate for a certain period of time, depending on the device's operation state, until there is an instruction from the device system. As a result, the interruption of the substrate processing apparatus 100 during the film-forming process may be avoided and lot defect may be reduced as much as possible.

According to the embodiment, the life of the pump may be predicted by the spike current of the pump, and the failure of the pump due to attached substances may be predicted by accumulated amount of a specific gas used in the substrate processing apparatus 100. Also according to the embodiment, an alarm may be issued for the operator via the display unit 31 or an alarm message may be transmitted to notify the operator of the customer company. Therefore, the pump may go through planned maintenance in advance. In addition, decrease in the operating rate of the device due to unplanned maintenance and economic loss due to substrate loss by stopping the pump during the film-forming process may be prevented. Even when the pump system detects pump parts with different serial numbers due to the maintenance of the pump, the accumulated data related to the pump is automatically cleared. Therefore, the operator is relieved from manually clearing the accumulated data.

(7) Substrate Processing According to the Embodiment

Next, substrate processing using the substrate processing apparatus 100 serving as semiconductor manufacturing apparatus will be described. The substrate processing is one of the semiconductor manufacturing processes. Also, in the description below, the controller 240 controls the operations of the components included in the substrate processing apparatus 100. Hereinafter, the substrate processing will be described with reference to FIG. 14.

In the embodiment, the substrate processing will be exemplified by an example wherein film is formed on the wafers 200 by alternately supplying the first process gas (source gas) and the second process gas (reactive gas). For example, silicon nitride (SiN) film is formed on the wafers 200 using hexachlorodisilane ($Si_2Cl_6$, abbreviated as HCDS) gas as the source gas and $NH_3$ (ammonia) as the reactive gas. A predetermined film may be formed on the wafers 200 in advance and predetermined pattern may be formed on the wafers 200 or the predetermined film in advance.

<Substrate Loading Step S102>

In substrate loading step S102, the boat 217 is charged with the wafers 200, and the boat 217 charged with wafers 200 is then loaded into the process chamber 201.

<Film-Forming Step S104>

Next, film-forming step S104 for forming the film on the surfaces of the wafers 200 is performed. In the film-forming step S104, four steps described below, namely, first through fourth steps, are sequentially performed. While performing the first through the fourth steps, the wafers 200 are heated to predetermined temperature by the heater 207.

<First Step>

In the first step, the HCDS gas is supplied into the process chamber 201 by opening the valve (not shown) provided at the gas pipe 232a and the APC valve 242 provided at the exhaust pipe 231. Specifically, the HCDS gas having the flow rate thereof adjusted by the flow rate controller 241a is supplied from gas source (not shown) to the gas pipe 232a. The HCDS gas having the flow rate thereof adjusted is then supplied into the process chamber 201 through the gas supply holes of the nozzle 230a and exhausted through the exhaust pipe 241. At this time, the inner pressure of the process chamber 201 is adjusted to predetermined pressure. A silicon film is formed on the surfaces of the wafers 200 in the first step.

<Second Step>

In the second step, the valve (not shown) provided at the gas pipe 232a is closed to stop the supply of the HCDS gas. The APC valve 242 provided at the exhaust pipe 231 is opened. The exhaust device 246 and the main pump 247 exhaust the process chamber 201 to remove the gas remaining in the process chamber 201 from the process chamber 201. An inert gas such as $N_2$ gas having the flow rate thereof adjusted by the MFC 241b may be supplied into the process chamber 201 by opening the valve (not shown) provided at the purge gas supply pipe 232b. The inert gas such as $N_2$ supplied into the process chamber 201 purges the process chamber 201, and the gas remaining in the process chamber 201 is extruded <Third Step>

In the third step, the $NH_3$ gas is supplied into the process chamber 201 by opening the valve (not shown) provided at the gas pipe 232a and the APC valve 242 provided at the exhaust pipe 231. Specifically, the $NH_3$ gas having the flow rate thereof adjusted by the MFC 241a is supplied from a gas source (not shown) to the gas pipe 232a. The $NH_3$ gas having the flow rate thereof adjusted is then supplied into the process chamber 201 through the gas supply holes of the nozzle 230a and exhausted through the exhaust pipe 231. At this time, the inner pressure of the process chamber 201 is adjusted to predetermined pressure. By chemical reaction between the silicon film on the surface of the wafers 200 formed by the HCDS gas supplied in the first step and the $NH_3$ gas supplied in the third step, a silicon nitride (SiN) film is formed on the surfaces of the wafers 200.

<Fourth Step>

In the fourth step, the process chamber 201 is purged again by the inert gas. The valve (not shown) provided at the gas pipe 232a is closed to stop the supply of the $NH_3$ gas. The APC valve 242 provided at the exhaust pipe 231 is opened. The exhaust device 246 and the main pump 247 exhaust the process chamber 201 to remove the gas remaining in the process chamber 201 from the process chamber 201. The gas remaining in the process chamber 201 may be further extruded by supplying the inert gas such as $N_2$ gas having the flow rate thereof adjusted by the MFC 241b through the gas pipe 232b to the process chamber 201 by opening the valve (not shown) provided at the gas pipe 232b.

A silicon nitride (SiN) film having desired thickness may be formed on the wafers 200 by performing cycle including the first step through the fourth step multiple times.

<Substrate Unloading Step S106>

Next, the boat 217 accommodating the wafers 200 having the SiN film formed thereon is unloaded from the process chamber 201.

Figure 14:
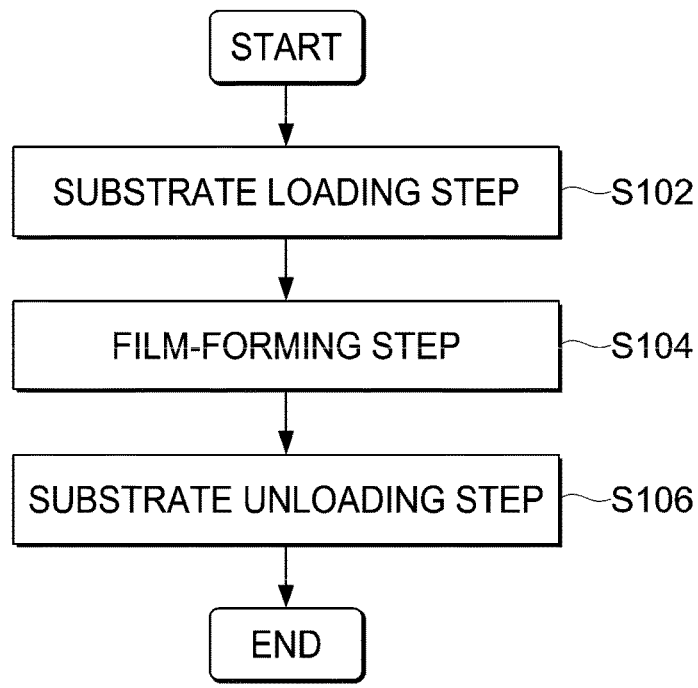
FIG. 14 is flowchart exemplifying the substrate processing preferably performed in the substrate processing apparatus according to the embodiment.
Figure 15:
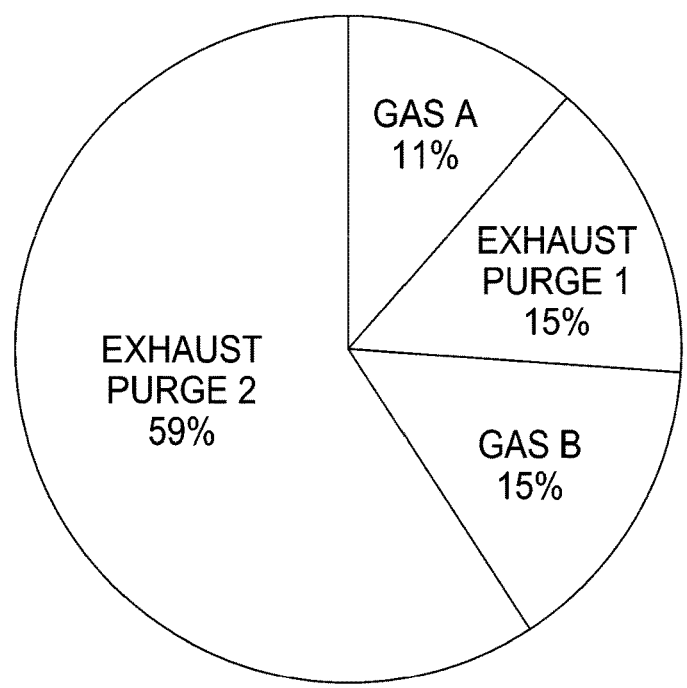
FIG. 15 illustrates a ratio of an exhaust step among all the steps of the process recipe executed in the substrate processing.

FIG. 15 illustrates the ratio of each step among all the steps of the process recipe executed in the substrate processing shown in FIG. 14. In FIG. 15, the source gas is labeled as "GAS A" and the reactive gas is labeled as "GAS B".

In the conventional process recipe shown in FIG. 15, the exhaust step (steps denoted by "EXHAUST PURGE 1" and "EXHAUST PURGE 2" in FIG. 15) accounts for 74% of all the steps of the process recipe. According to the embodiment, the exhaust device 246 is disposed in the vicinity of the processing furnace 202. Therefore, the exhaust capability is improved as compared to the conventional art, and the time necessary for performing the exhaust step is shortened, thereby improving the throughput.

As mentioned above, according to the embodiment described herein, the exhaust capability and operation efficiency of the apparatus are remarkably improved.

The embodiment has been described in detail. However, the above-described technique is not limited to the above-described embodiment. The above-described technique may be variously modified without departing from the gist thereof.

While the embodiment is described by way of an example in which the film is deposited on the wafers 200, the above-described technique is not limited thereto. The above-described technique may be applied to the processes such as an oxidation process, diffusion process, an annealing process and an etching process of the wafer 200 or the film formed on the wafers 200.

While batch type substrate processing apparatus capable of simultaneously processing plurality of substrates is exemplified in the above-described embodiment, the above-described technique is not limited thereto. While substrate processing apparatus having hot wall type processing furnace is exemplified in the above-described embodiment, the above-described technique is not limited thereto. For example, the above-described technique may be applied when substrate processing apparatus having cold wall type processing furnace is used to form the film.

The above-described technique is not limited to the substrate processing apparatus according to the embodiment configured to process semiconductor wafer. The above-described technique may also be applied to an apparatus such as an LCD (Liquid Crystal Display) manufacturing apparatus configured to process glass substrate.

What is claimed is:

1. A substrate processing apparatus comprising:
   a processing furnace;
   an exhaust unit configured to exhaust a gas from a process chamber defined by the processing furnace, the exhaust unit having a first sidewall and a second sidewall opposite to the first sidewall surface; and
   an exhaust device disposed adjacent to the exhaust unit and connected to the exhaust unit via a connecting pipe provided with a vibration-absorbing member, the exhaust device having a first sidewall and a second sidewall opposite to the first sidewall,
   wherein the processing furnace, the exhaust unit and the exhaust device are disposed on a same plane, and only the first sidewall of the first and the second sidewalls of the exhaust device is disposed in a space defined by extensions of the first and the second sidewalls of the exhaust unit.

2. The substrate processing apparatus according to claim 1, further comprising a gas supply unit having a first sidewall and a second sidewall and configured to supply the gas to the process chamber, wherein only the second sidewall of the first and the second sidewalls of the exhaust device is disposed in a space defined by extensions of the first and the second sidewalls of the gas supply unit.

3. The substrate processing apparatus according to claim 1, wherein a center of an inlet port of the exhaust device and a center of an outlet port of the exhaust device are misaligned form each other.

4. The substrate processing apparatus according to claim 1, further comprising a cover accommodating the connecting pipe.

5. The substrate processing apparatus according to claim 4, wherein the cover further accommodates the exhaust device.

6. The substrate processing apparatus according to claim 1, wherein the exhaust unit comprises: a pipe where the gas flows; a sensor configured to detect a pressure of the gas flowing in the pipe; and a valve configured to adjust the pressure of the gas flowing in the pipe by controlling an opening degree thereof.

7. The substrate processing apparatus according to claim 2, wherein the gas supply unit comprises: a pipe where the gas flows; and a flow rate controller configured to control a flow rate of the gas flowing in the pipe.

8. An exhaust system comprising:
   an exhaust unit configured to exhaust a gas from a process chamber defined by a processing furnace, the exhaust unit having a first sidewall and a second sidewall opposite to the first sidewall surface; and
   an exhaust device disposed adjacent to the exhaust unit and connected to the exhaust unit via a connecting pipe provided with a vibration-absorbing member, the exhaust device having a first sidewall and a second sidewall opposite to the first sidewall,
   wherein the processing furnace, the exhaust unit and the exhaust device are disposed on a same plane, and only the first sidewall of the first and the second sidewalls of the exhaust device is disposed in a space defined by extensions of the first and the second sidewalls of the exhaust unit.

9. A method for manufacturing a semiconductor device, comprising:
   (a) supplying a source gas;
   (b) supplying a reactive gas; and
   (c) exhausting the source gas and the reactive gas,
   wherein in (c), the source gas and the reactive gas are exhausted by an exhaust system comprising:
   an exhaust unit configured to exhaust a gas from a process chamber defined by a processing furnace, the exhaust unit having a first sidewall and a second sidewall opposite to the first sidewall; and
   an exhaust device disposed adjacent to the exhaust unit and connected to the exhaust unit via a connecting pipe provided with a vibration-absorbing member, the exhaust device having a first sidewall and a second sidewall opposite to the first sidewall,
   wherein the processing furnace, the exhaust unit and the exhaust device are disposed on a same plane, and only the first sidewall of the first and the second sidewalls of the exhaust device is disposed in a space defined by extensions of the first and the second sidewalls of the exhaust unit.

* * * * *